(12) United States Patent
Sawamura

(10) Patent No.: US 6,939,810 B2
(45) Date of Patent: Sep. 6, 2005

(54) METHOD OF FORMING ISOLATION FILM

(75) Inventor: Kenji Sawamura, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 279 days.

(21) Appl. No.: 10/460,396

(22) Filed: Jun. 13, 2003

(65) Prior Publication Data

US 2004/0002219 A1 Jan. 1, 2004

(30) Foreign Application Priority Data

Jul. 1, 2002 (JP) ............................ 2002-192126

(51) Int. Cl.⁷ ............................ H01L 21/302
(52) U.S. Cl. ...................... 438/723; 438/724
(58) Field of Search ................ 438/689, 693, 438/700, 706, 710, 723, 724, 745, 756, 757

(56) References Cited

U.S. PATENT DOCUMENTS

| | | | |
|---|---|---|---|
| 5,470,778 A | * | 11/1995 | Nagata et al. ............ 438/246 |
| 6,261,921 B1 | * | 7/2001 | Yen et al. .................. 438/424 |
| 6,372,573 B2 | * | 4/2002 | Aoki et al. ................ 438/248 |
| 6,417,047 B1 | | 7/2002 | Isobe |
| 6,495,900 B1 | * | 12/2002 | Mouli et al. ............... 257/522 |
| 6,734,059 B1 | * | 5/2004 | Hummler ................... 438/243 |
| 2004/0014291 A1 | * | 1/2004 | Mehrad et al. ............ 438/296 |

FOREIGN PATENT DOCUMENTS

| | | |
|---|---|---|
| JP | 11-260906 | 9/1999 |
| JP | 2000-208613 | 7/2000 |
| JP | 2001-94075 | 4/2001 |

* cited by examiner

Primary Examiner—Kin-Chan Chen
(74) Attorney, Agent, or Firm—Westerman, Hattori, Daniels & Adrian, LLP

(57) ABSTRACT

A silicon oxide film and a silicon nitride film are formed on a silicon substrate. Then, isotropic etching is performed to the silicon nitride film by the total thickness of the silicon oxide film and a sacrifice oxide film after trenches for element isolation have been formed in the silicon substrate. Subsequently, a high-voltage operation section is covered with a resist film, and isotropic etching is performed to the silicon oxide film in a low-voltage operation section by a thickness of one gate oxide film.

25 Claims, 26 Drawing Sheets

METHOD OF FORMING ISOLATION FILM

CROSS-REFERENCE TO RELATED APPLICATIONS

This application is based upon and claims priority of Japanese Patent Application No. 2002-192126, filed on Jul. 1, 2002, the contents being incorporated herein by reference.

BACKGROUND OF THE INVENTION

1. Field of the Invention

The present invention relates to a method of forming an isolation film that isolates element regions by insulating film embedded in trenches (shallow trench isolation). The invention relates particularly to a method of forming the isolation film preferable for a semiconductor device having various kinds of transistors with gate insulating film of different thickness such as a flash memory.

2. Description of the Prior Art

With higher density of semiconductor devices, the shallow trench isolation that isolates the element regions by the insulating film embedded in the trenches has been used.

FIGS. 1A to 1F are sectional views showing a conventional manufacturing method of a semiconductor device in the order of process, in which the element regions are isolated by the shallow trench isolation.

First, as shown in FIG. 1A, the surface of a silicon substrate 11 is subjected to thermal oxidation to form a silicon oxide film ($SiO_2$) 12. Then, a silicon nitride film (SiN) 13 is formed on the silicon oxide film 12 by a CVD (Chemical Vapor Deposition) method. Finally, a resist film 14 is formed on the silicon nitride film 13 by a photolithography method, in which a portion corresponding to an element isolation region is open.

Next, the silicon nitride film 13 is etched using the resist film 14 as a mask. Then, after having removed the resist film 14, the silicon oxide film 12 is etched using the silicon nitride film 13 as a mask, and the silicon substrate 11 is further etched to form a trench 15 as shown in FIG. 1B.

Next, as shown in FIG. 1C, the wall surface and the bottom surface of the trench 15 are subjected to thermal oxidation to form a silicon oxide film 16. Subsequently, $SiO_2$ is deposited over the entire upper surface of the silicon substrate 11 to form a silicon oxide film 17 by a high-density plasma CVD method, and $SiO_2$ is thus embedded in the trench 15.

Then, as shown in FIG. 1D, the silicon oxide film 17 is polished until the silicon nitride film 13 is exposed and the surface thereof is made to be flat by a CMP (Chemical Mechanical Polishing) method. Hereinafter, $SiO_2$ embedded in the trench 15 is referred to as an isolation film (an element isolation film) 17a.

Next, as shown in FIG. 1E, the silicon nitride film 13 is removed by wet etching using hot phosphoric acid. Subsequently, the silicon oxide film 12 is removed by wet etching using hydrofluoric acid (HF). Then, a sacrifice oxide film 18 is formed on the surface of the silicon substrate 11 by a thermal oxidation method. Ion implantation of conductive impurities for threshold adjustment, for example, is performed onto the surface of the silicon substrate 11 via the sacrifice oxide film 18.

Next, after having removed the sacrifice oxide film 18, a gate oxide film 19 is formed on the surface of the silicon substrate 11 as shown in FIG. 1F. Subsequently, a gate electrode is formed in a predetermined pattern on the gate oxide film 19, the conductive impurities are implanted onto the silicon substrate 11 using the gate electrode as a mask, and a source/drain region is formed. With this procedure, the semiconductor device in which the element regions are isolated by the shallow trench isolation (isolation film 17a) is manufactured.

However, the above-described conventional manufacturing method of the semiconductor device has the following problems. Specifically, when removing the silicon oxide film 12 and the sacrifice oxide film 18 by hydrofluoric acid, recess called a divot can occur in the isolation film 17a because the isolation film 17a is also etched, as shown in FIG. 2.

When forming the flash memory or the like, the gate electrode is formed on the isolation film 17a as well. However, if a part of the gate electrode is embedded in the divot area, electric field concentrates on this area to generate a parasitic transistor having a low threshold voltage. A hump occurs in the voltage-current characteristic of a transistor due to the parasitic transistor, as shown in FIG. 3. This changes the threshold voltage of the transistor to cause a problem such as an increase of an off-leak current.

To prevent the divot from occurring even if the isolation film 17a is etched by hydrofluoric acid, isotropic etching may be performed to the silicon nitride film 13 before forming the isolating film 17a. Alternatively, as shown in FIG. 4, the trench 15 may be formed after forming sidewalls 19 on the sides of the silicon nitride film 13 (Patent Application Publication (KOKAI) Hei11-260906, 2000-208613).

However, such processes are inadequate as countermeasures to the divot in manufacturing the flash memory.

FIG. 5 is a schematic view showing the constitution of the flash memory. The flash memory has a memory cell section where a transistor having two gate electrodes (a floating gate 21a and a control gate 21b) is formed, a low-voltage operation section where a transistor driven by a low-voltage of approximately 1.2V to 3.3V is formed, and a high-voltage operation section where a transistor driven by a high-voltage of approximately 20V is formed. The thickness of gate insulating film 23 in the low-voltage operation section is thinner than that of a gate insulating film 24 of the high-voltage operation section. Note that the thickness of a gate insulating film 22 in the memory cell section is the same as that of the gate insulating film 23 of the low-voltage operation section.

The gate insulating films of these transistors are generally formed simultaneously. In other words, after having formed a thick insulating film, the resist film is formed on the insulating film in the high-voltage operation section, and the insulating film in the low-voltage operation section and the memory cell section (hereinafter, simply referred to as a 'low-voltage operation section') is etched only by 100 angstroms to make it thin.

In the case of preventing occurrence of the divots by the isotropic etching to the silicon nitride film, when the isotropic etching is performed to the silicon nitride film according to the etching condition that the divots do not occur in the high-voltage operation section, the divots occur in the low-voltage operation section although the divots do not occur in the high-voltage operation section, as shown in FIG. 6. When the isotropic etching is performed to the silicon nitride film according to the etching condition that the divots do not occur in the low-voltage operation section, the isolation film remains on the element region of the high-voltage operation section, which makes the element region narrow and hampers high integration.

Similarly, in the case of preventing occurrence of the divots by the sidewalls, formation of the sidewalls according to the formation condition that the divots do not occur in the high-voltage operation section does not exert effect to prevent the divots in the low-voltage operation section, and formation of the sidewalls according to the formation condition that the divots do not occur in the low-voltage operation section leaves the isolation film on the element region in the high-voltage operation section.

Note that Patent Application Publication (KOKAI) 2001-94075 describes a method to prevent occurrence of the divots at the edge portion of the isolation film (shallow trench isolation). However, a problem similar to the above-described one occurs in the case that a peripheral circuit section is provided with two kinds of transistors with gate insulating film of different thickness.

SUMMARY OF THE INVENTION

The object of the present invention, in a semiconductor device having various kinds of transistors with gate insulating film of different thickness, is to provide a method of forming the isolation film, that is capable of achieving higher performance and higher integration of the semiconductor device by preventing occurrence of the divots at the edge portion of the isolation film (shallow trench isolation) and preventing the isolation film from extending on the element region.

The first method of forming the isolation film of the present invention comprises the steps of: forming a first silicon oxide film on a semiconductor substrate; forming the silicon nitride film on the first silicon oxide film; performing patterning to the silicon nitride film; etching the first silicon oxide film and the semiconductor substrate using the silicon nitride film as a mask and forming trenches severally in a first region and a second region of the semiconductor substrate; a first isotropic etching in which isotropic etching is performed to the silicon nitride film; a second isotropic etching in which the first region is protected by a first resist film and isotropic etching is performed to the silicon nitride film in the second region; removing the first resist film; depositing silicon oxide over the entire upper surface of the semiconductor substrate and forming a second silicon oxide film; removing the second silicon oxide film until the silicon nitride film exposes; removing the silicon nitride film; oxidizing the surface of the semiconductor substrate and forming a third silicon oxide film; a third isotropic etching in which the third silicon oxide film is removed and performing isotropic etching to the remaining second silicon oxide film; oxidizing the surface of the semiconductor substrate and forming a fourth silicon oxide film; a fourth isotropic etching in which the first region is protected by a second resist film, the fourth silicon oxide film in the second region is removed, and isotropic etching is performed to the second oxide film in the second region; removing the second resist film; and oxidizing the surface of the semiconductor substrate and forming a fifth silicon oxide film.

In the present invention, an offset quantity of the second silicon oxide film in the first region and the second region (the distance from a trench edge to the second silicon oxide film) can be individually set before the step of removing the silicon oxide film on the semiconductor substrate surface. Thus, the isolation film without a divot can be formed and the isolation film can be prevented from extending on the element region.

In this case, to securely obtain the above-described effects, it is preferable to determine an etching quantity in the first isotropic etching step based on the total of the thickness of the first silicon oxide film and the thickness of the third silicon oxide film. Further, it is preferable to determine the etching quantity in the second isotropic etching step based on the thickness of the fifth silicon oxide film.

The second method of forming the isolation film of the present invention comprises the steps of: forming the first silicon oxide film on the, semiconductor substrate; forming the silicon nitride film on the first silicon oxide film; performing patterning to the silicon nitride film; etching the first silicon oxide film and the semiconductor substrate using the silicon nitride film as a mask and forming trenches severally in the first region and the second region of the semiconductor substrate; the first isotropic etching in which isotropic etching is performed to the silicon nitride film; depositing silicon oxide over the entire upper surface of the semiconductor substrate and forming the second silicon oxide film; removing the second silicon oxide film until the silicon nitride film exposes; removing the silicon nitride film; the second isotropic etching in which the second region is protected by the first resist film and isotropic etching is performed to the second silicon oxide film in the first region; removing the first resist film; oxidizing the surface of the semiconductor substrate and forming the third silicon oxide film; the third isotropic etching in which the third silicon oxide film is removed and performing isotropic etching to remaining the second silicon oxide film; oxidizing the surface of the semiconductor substrate and forming the fourth silicon oxide film; the fourth isotropic etching in which the first region is protected by the second resist film, the fourth silicon oxide film in the second region is removed, and isotropic etching is performed to the second oxide film in the second region; removing the second resist film; and oxidizing the surface of the semiconductor substrate and forming the fifth silicon oxide film.

In the present invention, the offset quantity of the second silicon oxide film in the first region and the second region can be individually set before the step of removing the silicon oxide film on the semiconductor substrate surface as well. Thus, the isolation film without a divot can be formed and the isolation film can be prevented from extending on the element region.

In this case, to securely obtain the above-described effects, it is preferable to determine the etching quantity in the first isotropic etching step based on the total of the thickness of the first silicon oxide film, the thickness of the third silicon oxide film, and the thickness of the fourth silicon oxide film. Further, it is preferable to determine the etching quantity in the second isotropic etching step based on the thickness of the third silicon oxide film.

The third method of forming the isolation film of the present invention comprises the steps of: forming the first silicon oxide film on the semiconductor substrate; forming the silicon nitride film on the first silicon oxide film; performing patterning to the silicon nitride film and the first silicon oxide film and forming opening portions at which the semiconductor substrate exposes severally in a first region and a second region; forming sidewalls composed of silicon oxide on the side of the silicon nitride film; a first isotropic etching in which the second region of the semiconductor substrate is protected by the first resist film and isotropic etching is performed to the sidewalls in the first region; removing the first resist film; etching the semiconductor substrate using the silicon nitride film and the sidewalls as a mask and forming the trenches severally in the first region and the second region; depositing silicon oxide over the entire upper surface of the semiconductor substrate and forming the second silicon oxide film; removing the second silicon oxide film until the silicon nitride film exposes; removing the silicon nitride film; the second isotropic etching in which the first silicon oxide film is removed and isotropic etching is performed to remaining the second silicon oxide film; oxidizing the surface of the semiconductor substrate and forming the third silicon oxide film; the third isotropic etching in which the third silicon oxide film is removed and performing isotropic etching to the second silicon oxide film; oxidizing the surface of the semiconductor substrate and forming the fourth silicon oxide film; the fourth isotropic etching in which the first region is protected by the second resist film, the fourth silicon oxide film in the second region is removed, and isotropic etching is performed to the second oxide film in the second region; removing the second resist film; and oxidizing the surface of the semiconductor substrate and forming the fifth silicon oxide film.

In the present invention, the offset quantity of the second silicon oxide film in the first region and the second region can be individually set before the step of removing the silicon oxide film on the semiconductor substrate surface as well. Thus, the isolation film without a divot can be formed and the isolation film can be prevented from extending on the element region.

In this case, to securely obtain the above-described effects, it is preferable to determine the sidewall width (a width at the bottom portion of the sidewall), in the step of forming the sidewalls, based on the total of the thickness of the first silicon oxide film, the thickness of the third silicon oxide film, and the thickness of the fourth silicon oxide film. Further, it is preferable to determine the etching quantity in the first isotropic etching step based on the total of the thickness of the first silicon oxide film and the third silicon oxide film.

The fourth method of forming the isolation film of the present invention comprises the steps of: forming the first silicon oxide film on the semiconductor substrate; forming the silicon nitride film on the first silicon oxide film; performing patterning to the silicon nitride film and the first silicon oxide film and forming opening portions at which the semiconductor substrate exposes severally in the first region and the second region; forming the sidewalls composed of silicon oxide on the side of the silicon nitride film; etching the semiconductor substrate using the silicon nitride film and the sidewalls as a mask and forming the trenches severally in the first region and the second region; depositing silicon oxide over the entire upper surface of the semiconductor substrate and forming the second silicon oxide film; removing the second silicon oxide film until the silicon nitride film exposes; removing the silicon nitride film; the first isotropic etching in which the first silicon oxide film is removed and isotropic etching is performed to remaining the second silicon oxide film; the second isotropic etching in which the second region is protected by the first resist film and isotropic etching is performed to the second silicon oxide film in the first region; removing the first resist film; oxidizing the surface of the semiconductor substrate and forming the third silicon oxide film; the third isotropic etching in which the third silicon oxide film is removed and performing isotropic etching to the second silicon oxide film; oxidizing the surface of the semiconductor substrate and forming the fourth silicon oxide film; the fourth isotropic etching in which the first region is protected by the second resist film, the fourth silicon oxide film in the second region is removed, and isotropic etching is performed to the second oxide film in the second region; removing the second resist film; and oxidizing the surface of the semiconductor substrate and forming the fifth silicon oxide film.

In the present invention, the offset quantity of the second silicon oxide film in the first region and the second region can be individually set before the step of removing the silicon oxide film on the semiconductor substrate surface as well. Thus, the isolation film without a divot can be formed and the isolation film can be prevented from extending on the element region.

In this case, to securely obtain the above-described effects, it is preferable to determine the sidewall width, in the step of forming the sidewalls, based on the total of the thickness of the first silicon oxide film, the thickness of the third silicon oxide film, and the thickness of the fourth silicon oxide film. Further, it is preferable to determine the etching quantity in the second isotropic etching step based on the third silicon oxide film.

The fifth method of forming the isolation film of the present invention comprises the steps of: forming the first silicon oxide film on the semiconductor substrate; forming the silicon nitride film on the first silicon oxide film; performing patterning to the silicon nitride film and the first silicon oxide film and forming an opening portion at which the semiconductor substrate exposes in the first region; etching the semiconductor substrate in the first region using the silicon nitride film as a mask and forming a first trench; the first isotropic etching in which isotropic etching is performed to the silicon nitride film; protecting the first region by the first resist film formed on the semiconductor substrate and etching the silicon nitride film and the first silicon oxide film on the second region of the semiconductor substrate via the opening portion of the first resist film; etching the second region of the semiconductor substrate via the opening portion of the first resist film and forming a second trench; the second isotropic etching in which isotropic etching is performed to the silicon nitride film in the second region via the opening portion of the first resist film; removing the first resist film; depositing silicon oxide over the entire upper surface of the semiconductor substrate and forming the second silicon oxide film; removing the second silicon oxide film until the silicon nitride film exposes; removing the silicon nitride film; the third isotropic etching in which the first silicon oxide film is removed and performing isotropic etching to remaining the second silicon oxide film; oxidizing the surface of the semiconductor substrate and forming the third silicon oxide film; the fourth isotropic etching in which the third silicon oxide film is removed, and isotropic etching is performed to the second silicon oxide film; oxidizing the surface of the semiconductor substrate and forming the fourth silicon oxide film; a fifth isotropic etching in which the second region is protected by the second resist film, the fourth silicon oxide film in the first region is removed, and isotropic etching is performed to the second silicon oxide film in the first region; removing the second resist film; and oxidizing the surface of the semiconductor substrate and forming the fifth silicon oxide film.

In the present invention, the offset quantity of the second silicon oxide film in the first region and the second region can be individually set before the step of removing the silicon oxide film on the semiconductor substrate surface as well. Thus, the isolation film without a divot can be formed and the isolation film can be prevented from extending on the element region.

In this case, to securely obtain the above-described effects, it is preferable to determine the etching quantity in the first isotropic etching step based on the total of the thickness of the first silicon oxide film, the thickness of the third silicon oxide film, and the thickness of the fourth silicon oxide film. Further, it is preferable to determine the etching quantity in the second isotropic etching step based on the third silicon oxide film.

DESCRIPTION OF THE PREFERRED EMBODIMENTS

In the following, the preferred embodiments of the present invention will be described referring to the accompanying drawings.

(First Embodiment)

FIGS. 7A to 7K are the sectional views showing in the order of process the method of forming the isolation film (the element isolation film) of the first embodiment according to the present invention. Note that the left side and the right side of the drawings in FIGS. 7A to 7K respectively show the high-voltage operation section and the low-voltage operation section.

Figure 1A:
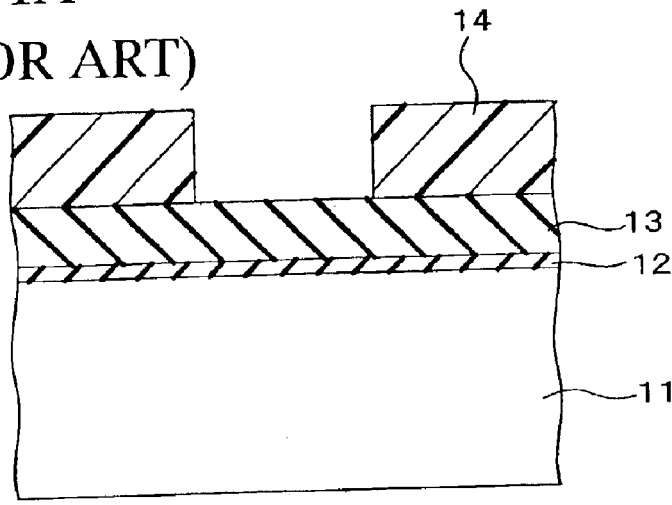
FIGS. 1A to 1F are sectional views showing a conventional manufacturing method of a semiconductor device in which the element regions are isolated by the shallow trench isolation.
Figure 1B:
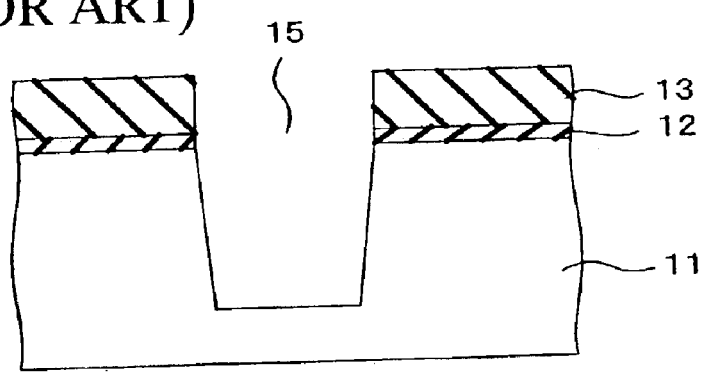
Figure 1C:
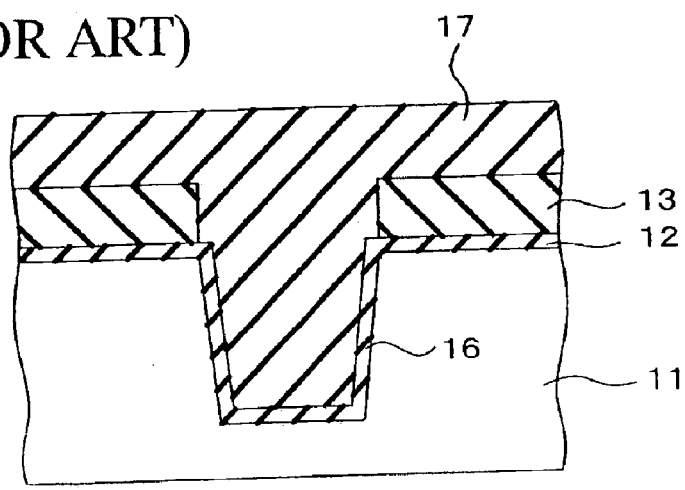
Figure 1D:
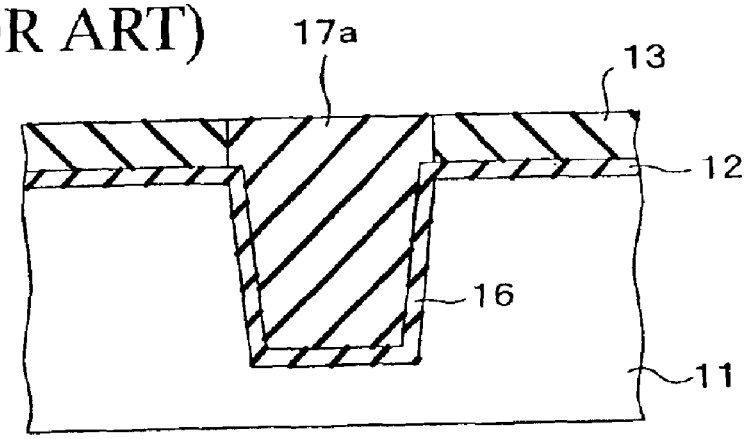
Figure 1E:
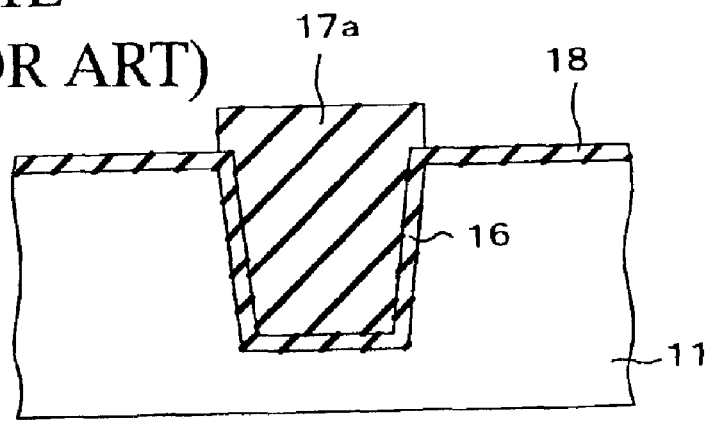
Figure 1F:
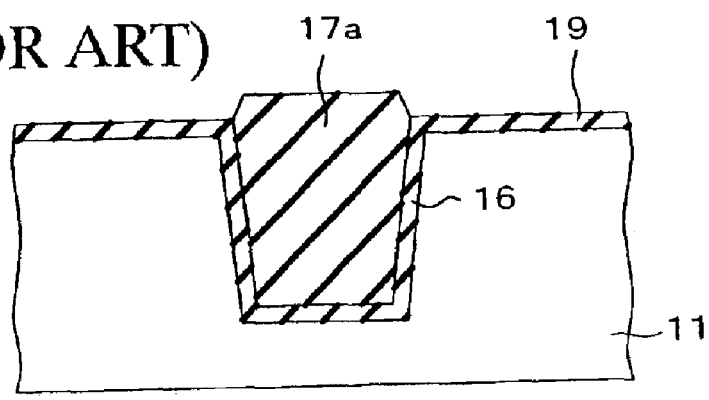
Figure 2:
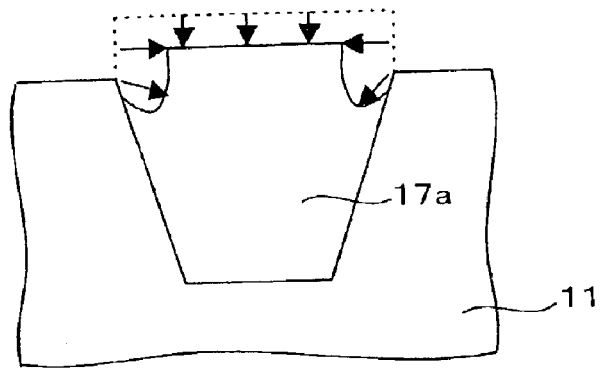
FIG. 2 is a schematic view showing the divots.
Figure 3:
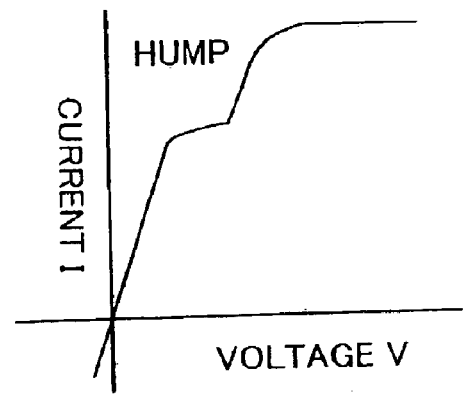
FIG. 3 is a view showing an example of transistor characteristic of a semiconductor device in which the divots occurred.
Figure 4:
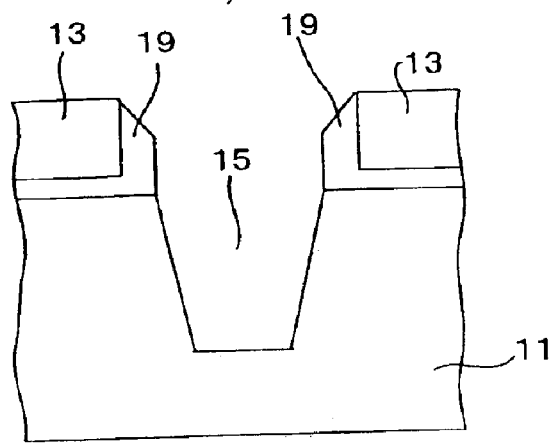
FIG. 4 is a schematic view showing a method of preventing occurrence of the divots by the sidewalls.
Figure 5:
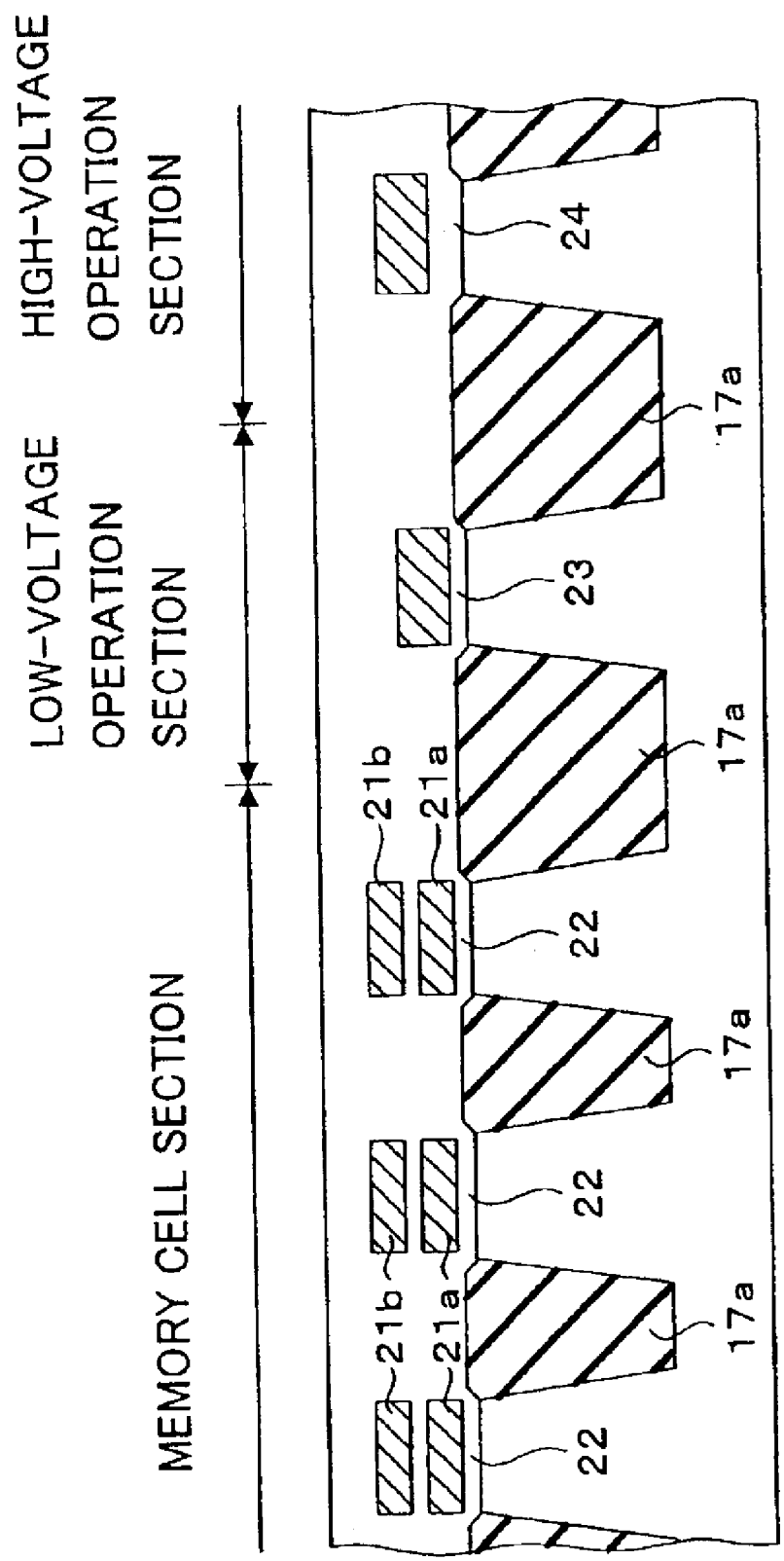
FIG. 5 is a schematic view showing the constitution of a flash memory.
Figure 6:
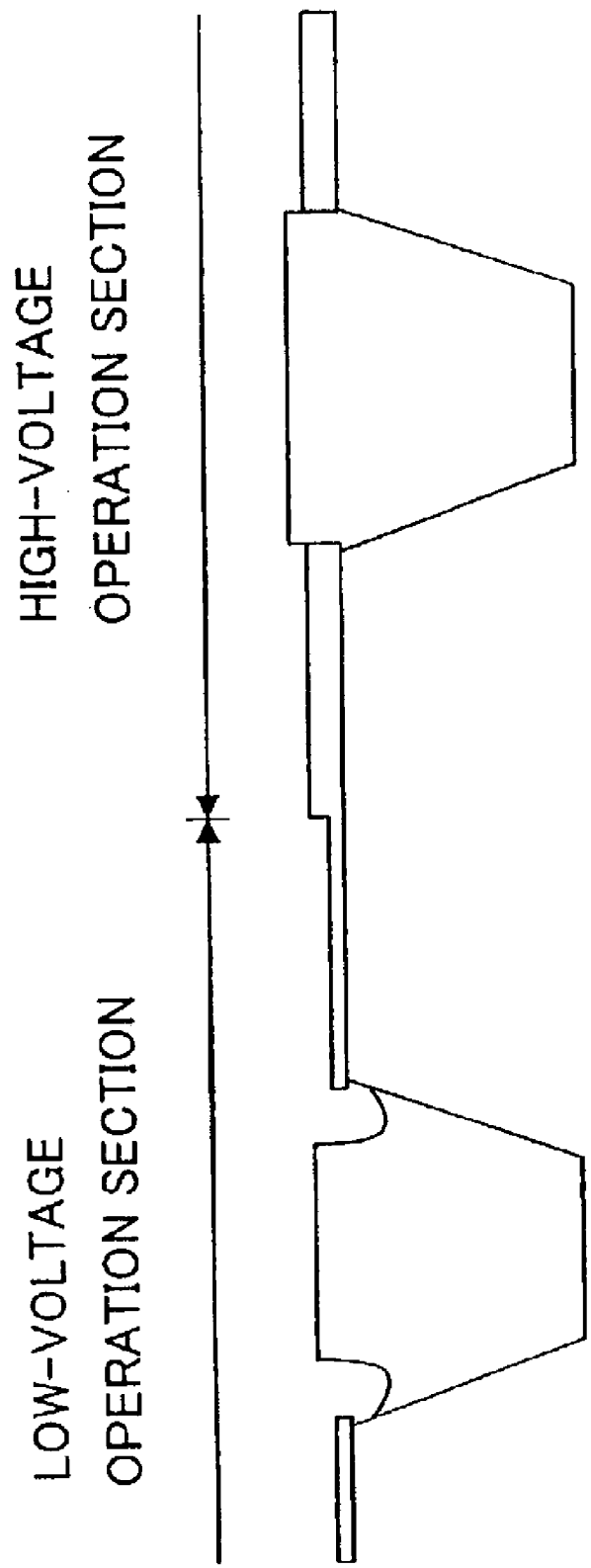
FIG. 6 is a schematic view showing a conventional problem.
Figure 7A:
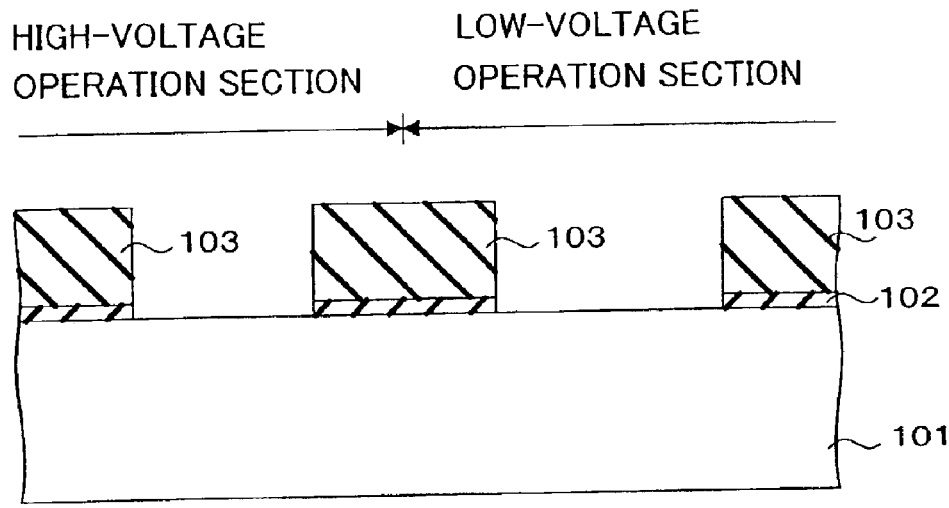
FIGS. 7A to 7K are views showing a method of forming the isolation film of the first embodiment according to the present invention.

First, as shown in FIG. 7A, a silicon oxide film 102 is formed in the thickness of approximately 10 nm on a silicon substrate 101 by the thermal oxidation method, and a silicon nitride film 103 is formed thereon in the thickness of 100 nm to 200 nm, for example, by the CVD method. Then, the silicon nitride film 103 and the silicon oxide film 102 in the element isolation region are removed by the photolithography method to partially expose the silicon substrate 101.

Figure 7B:
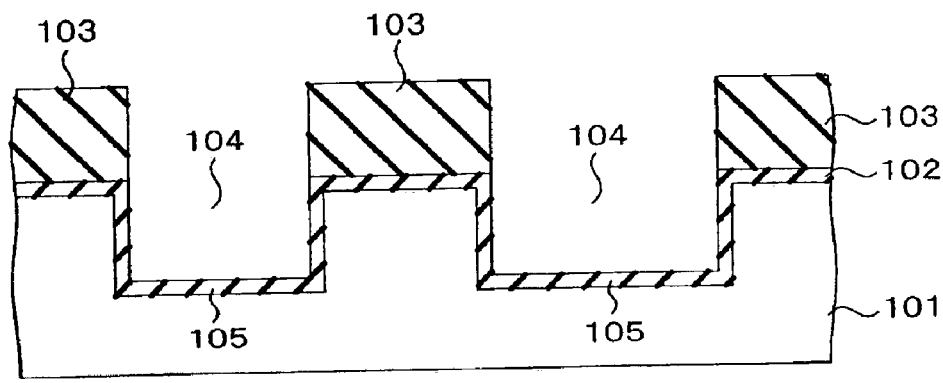

Next, as shown in FIG. 7B, the silicon substrate 101 is etched only by the thickness of approximately 300 nm using the silicon nitride film 103 as a mask to form trenches 104. Subsequently, a silicon oxide film 105 having the thickness of 1 nm to 3 nm is formed on the wall surface and the bottom surface of the trenches 104 by the thermal oxidation method. This silicon oxide film 105 is formed to protect the silicon substrate 101 when etching the silicon nitride film 103 in the next process.

Figure 7C:
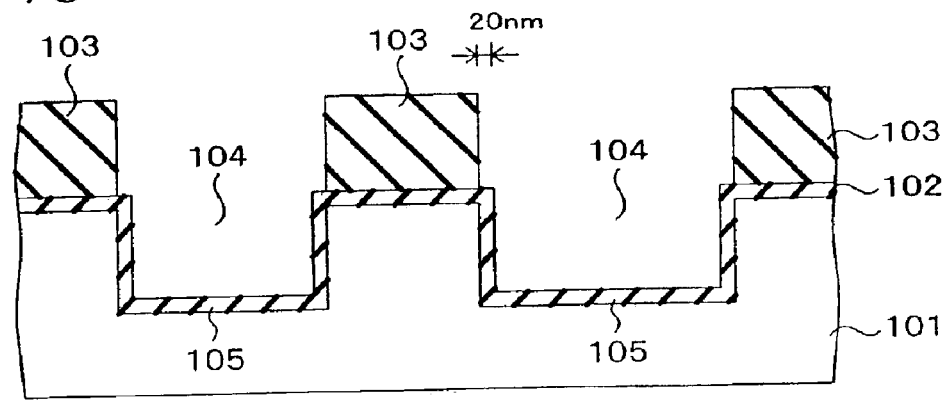

Next, as shown in FIG. 7C, isotropic etching is performed to the silicon nitride film 103 only by approximately 20 nm with wet etching using hot phosphoric acid, for example. This produces the distance of approximately 20 nm from the edge of the trench 104 to the silicon nitride film 103.

Note that isotropic etching can be performed to the silicon nitride film 103 by dry etching when etching conditions are properly selected.

Figure 7D:
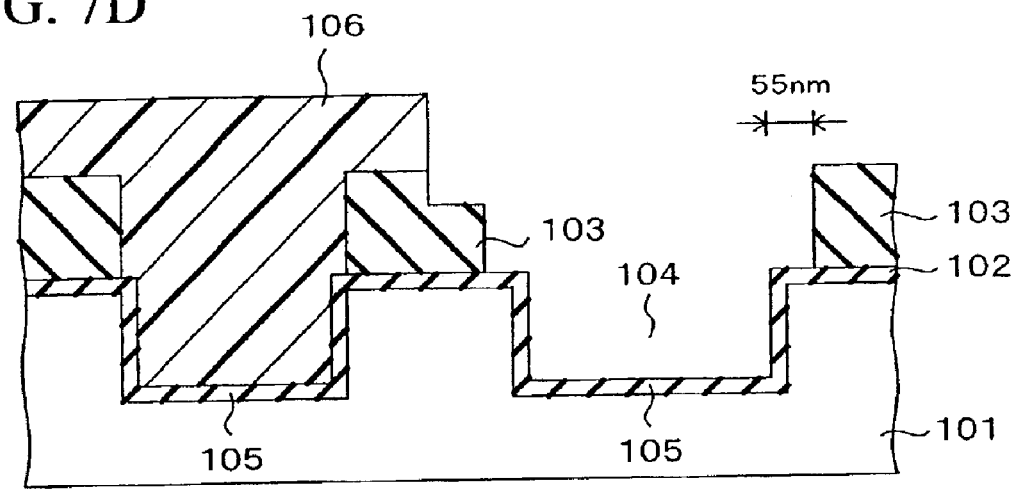

Next, as shown in FIG. 7D, after having coated photoresist over the entire upper surface of the silicon substrate 101, selective exposure and development processing are applied thereto, and a resist film 106 covering only the high-voltage operation section is formed. Then, isotropic etching is performed to the silicon nitride film 103 only by approximately 35 nm using this resist film 106 as a mask. This produces the distance of 55 nm from the edge of the trench 104 to the silicon nitride film 103 in the low-voltage operation section. Subsequently, the resist film 106 is removed.

Figure 7E:
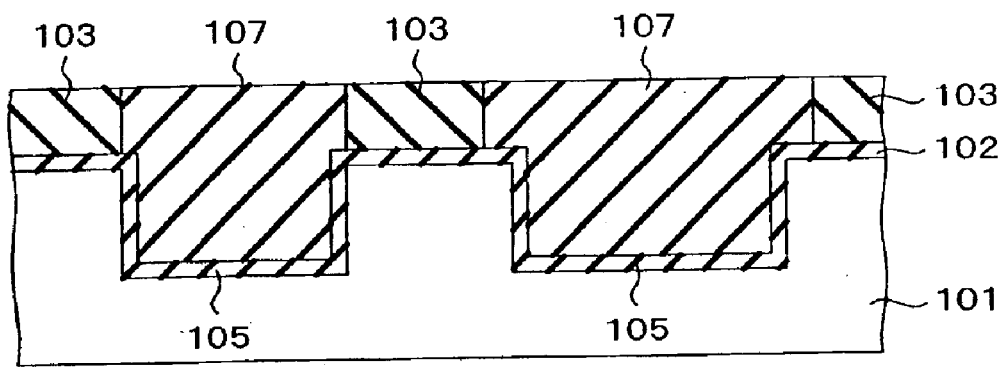

Next, $SiO_2$ is deposited by the high-density plasma CVD method over the entire upper surface of the silicon substrate 101 to form the silicon oxide film, and $SiO_2$ is embedded in the trenches 104. Subsequently, as shown in FIG. 7E, the silicon oxide film is polished until the silicon nitride film 103 exposes and the surface is made to be flat by the CMP method. Hereinafter, $SiO_2$ embedded in the trench 104 is referred to as an isolation film 107.

Figure 7F:
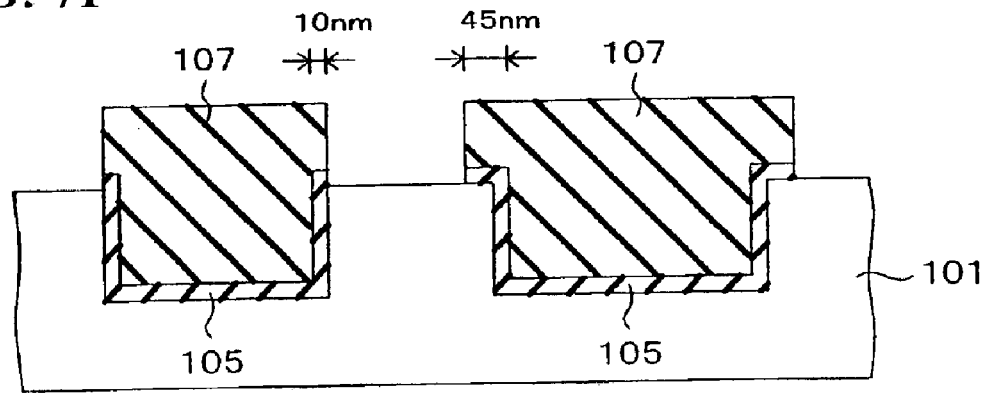

Next, as shown in FIG. 7F, the silicon nitride film 103 is removed by hot phosphoric acid. Subsequently, the silicon oxide film 102 exposed on the substrate 101 is removed by hydrofluoric acid processing. At this stage, the offset quantity of the isolation film 107 (the distance from the edge of the isolation film to the trench edge) in the high-voltage operation section is approximately 10 nm, and the offset quantity of the isolation film 107 in the low-voltage operation section is approximately 45 nm. Further, the heights of the isolation film 107 in the high-voltage operation section and the low-voltage operation section are the same.

Figure 7G:
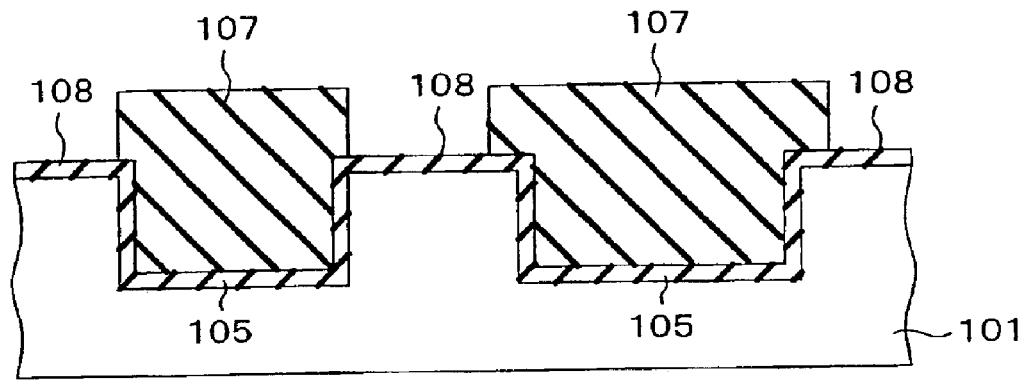

Next, as shown in FIG. 7G, the surface of the silicon substrate 101 exposed is subjected to thermal oxidation to form a sacrifice oxide film 108 having the thickness of approximately 10 nm. At this point, the sacrifice oxide film 108 takes in impurities or portions with many defects in the surface of the silicon substrate 101. Subsequently, the conductive impurities for threshold value adjustment, for example, are introduced into the silicon substrate 101 via this sacrifice oxide film 108.

Figure 7H:
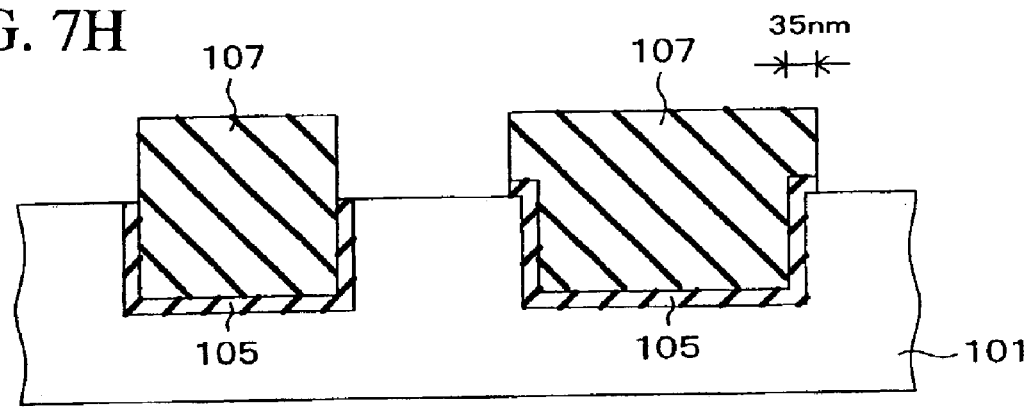

Next, as shown in FIG. 7H, the sacrifice oxide film 108 is removed by hydrofluoric acid. At this point, since isotropic etching is performed to the isolation film 107 as well, the offset quantity of the isolation film 107 becomes 0 in the high-voltage operation section, and the offset quantity of the isolation film 107 becomes approximately 35 nm in the low-voltage operation section.

Figure 7I:
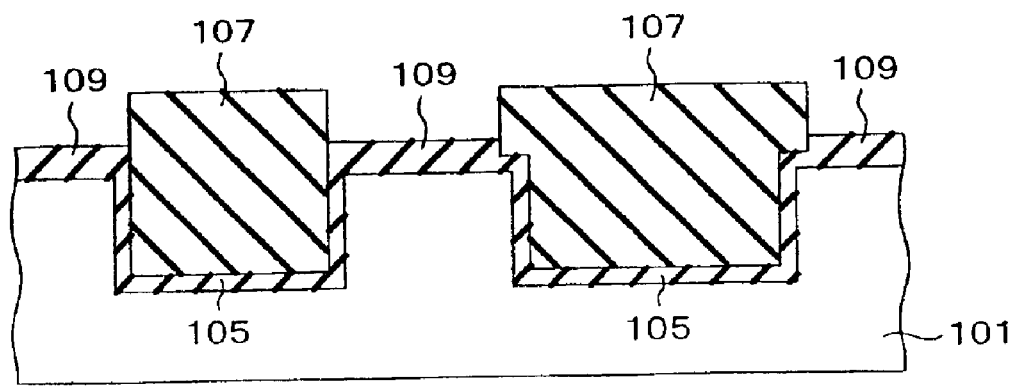

Next, as shown in FIG. 7I, thermal oxidation is performed to the surface of the silicon substrate 101 to form a gate oxide film 109 having the thickness of approximately 35 nm.

Figure 7J:
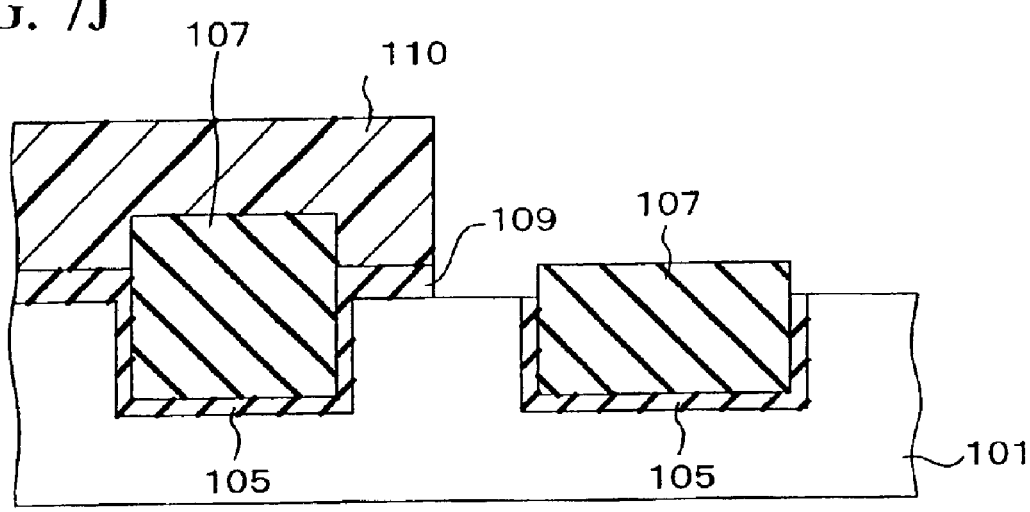

Next, photoresist is coated over the entire upper surface of the silicon substrate 101, selective exposure and development processing are applied thereto, and a resist film 110 covering only the high-voltage operation section is formed, as shown in FIG. 7J. Subsequently, the gate oxide film 109 in the low-voltage operation section is removed by hydrofluoric acid. At this point, isotropic etching is performed to the isolation film 107 in the low-voltage operation section as well, and the offset quantity becomes 0. Further, the height of the isolation film 107 in the low-voltage operation section becomes lower than that of the isolation film 107 in the high-voltage operation section by approximately 35 nm.

Figure 7K:
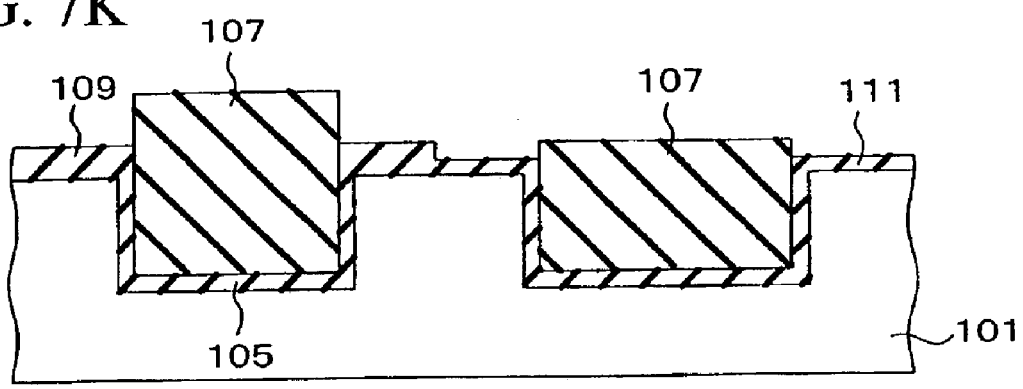

Next, after having removed the resist film 110, thermal oxidation is performed to the surface of the silicon substrate 101 to form a gate oxide film 111 having the thickness of approximately 8 nm, as shown in FIG. 7K. With such procedure, it is possible to form the gate oxide film 109 severally in the high-voltage operation section and the gate oxide film 111 in the low-voltage operation section in a desired thickness.

According to this embodiment, after having formed the trenches 104 severally in the low-voltage operation section and the high-voltage operation section, the high-voltage operation section is covered with the resist film 106 and isotropic etching is performed to the silicon nitride film 103 in the low-voltage operation section. Thus, it is possible to individually set the offset quantity in the high-voltage operation section and the low-voltage operation section before the hydrofluoric acid processing. Therefore, the isolation film without a divot can be formed and the isolation film can be prevented from extending on the element region. As a result, higher performance and higher integration of the semiconductor device such as the flash memory can be achieved.

Figure 8:
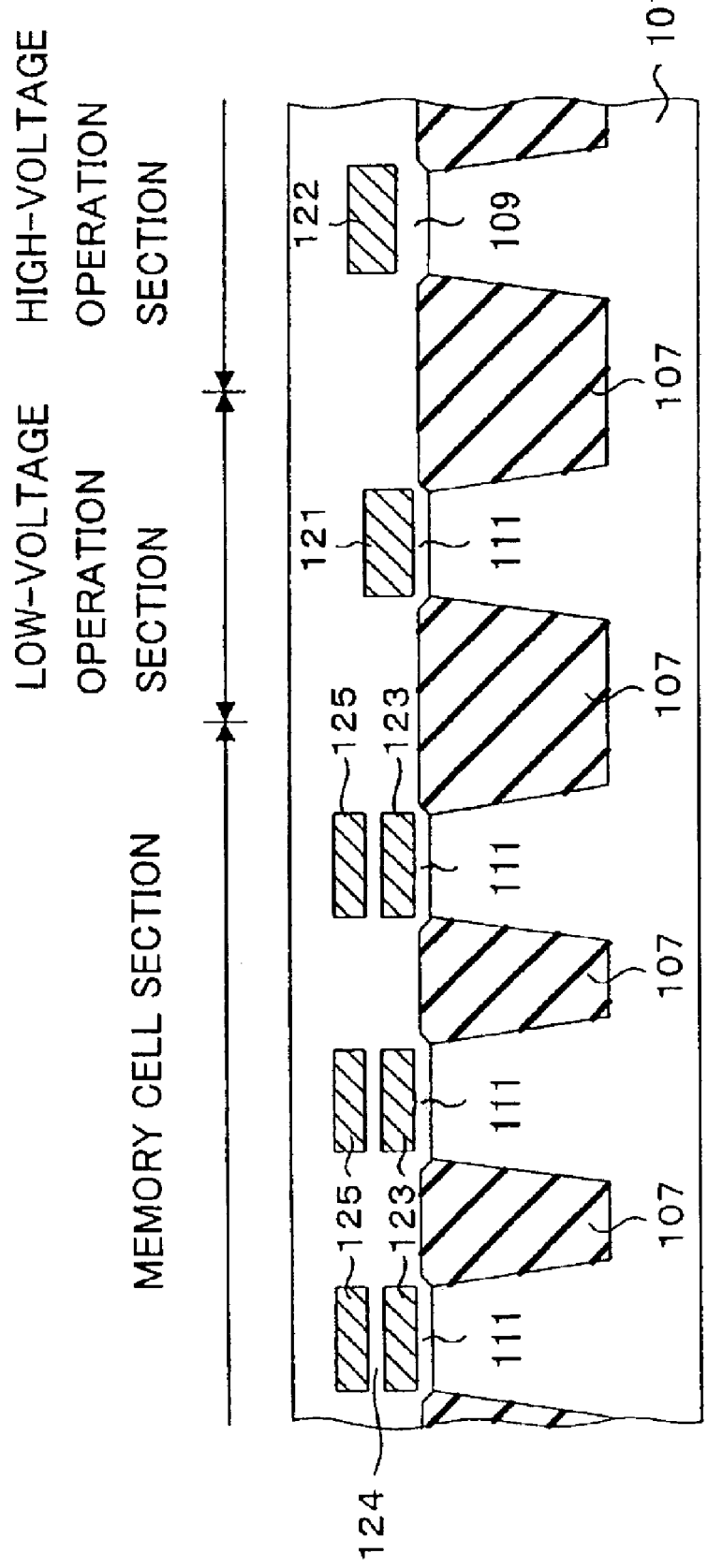
FIG. 8 is a schematic view showing an example where the first embodiment has been applied to manufacture of the flash memory.

FIG. 8 is the schematic sectional view showing an example where this embodiment has been applied to manufacture of a flash memory.

As described above, after having formed the thin gate oxide film 111 and the thick gate oxide film 109 on the silicon substrate 101, gate electrodes (121, 122) are respectively formed in the low-voltage operation section and the high-voltage operation section. Further, in the memory cell section, floating gates 123 are formed on the thin gate oxide film 111, and control gates 125 are formed thereon via a silicon oxide film 124. The flash memory is thus completed.

Since this flash memory does not have divots in the isolation film, good transistor characteristic can be obtained. In addition, high integration is achieved since the isolation film is prevented from extending on the element region.

(Second Embodiment)

FIGS. 9A to 9K are the sectional views showing in the order of process the method of forming the isolation film of the second embodiment according to the present invention. Note that the left side and the right side of the drawings in FIGS. 9A to 9K respectively show the high-voltage operation section and the low-voltage operation section.

Figure 9A:
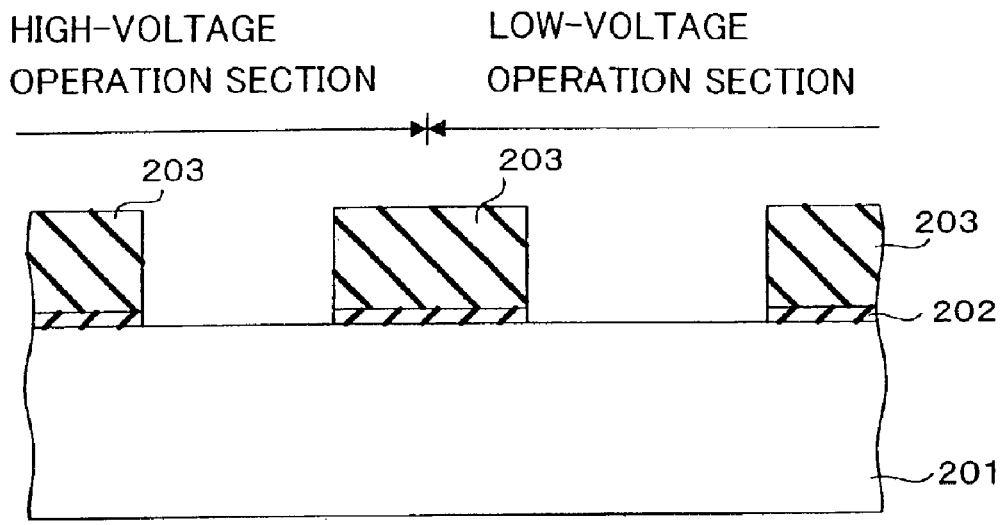
FIGS. 9A to 9K are views showing a method of forming the isolation film of the second embodiment according to the present invention.

First, as shown in FIG. 9A, a silicon oxide film 202 is formed in the thickness of approximately 10 nm on a silicon substrate 201 by the thermal oxidation method, and a silicon nitride film 203 is formed thereon in the thickness of 100 nm to 200 nm, for example, by the CVD method. Then, the silicon nitride film 203 and the silicon oxide film 202 in the element isolation region are removed by the photolithography method to partially expose the silicon substrate 201.

Figure 9B:
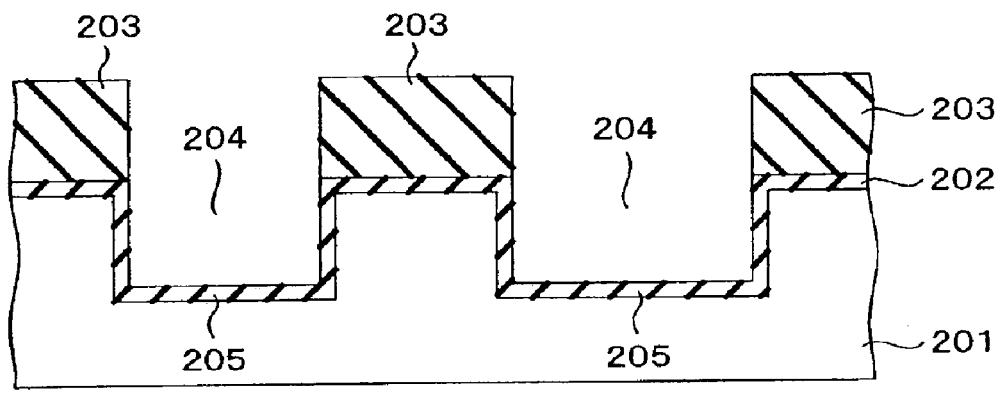

Next, as shown in FIG. 9B, the silicon substrate 201 is etched only by the thickness of approximately 300 nm using the silicon nitride film 203 as a mask to form trenches 204. Subsequently, a silicon oxide film 205 having the thickness of 1 nm to 3 nm is formed on the wall surface and the bottom surface of the trenches 204 by the thermal oxidation method. This silicon oxide film 205 is formed to protect the silicon substrate 201 when etching the silicon nitride film 203 in the next process.

Figure 9C:
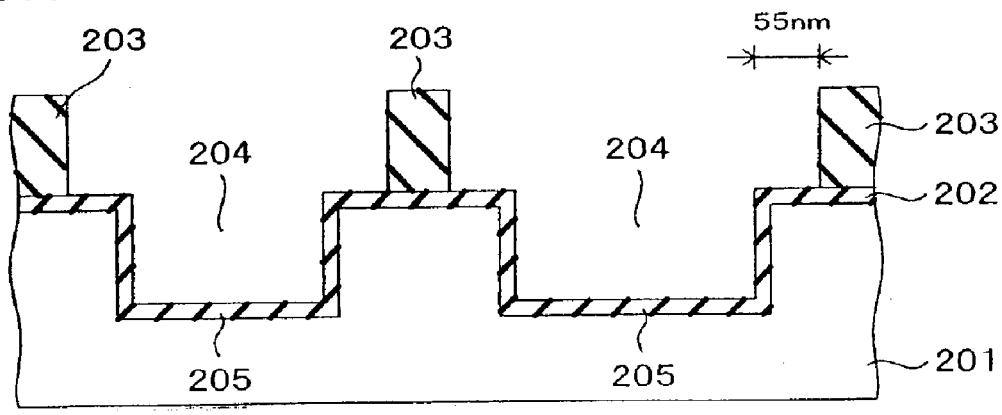

Next, as shown in FIG. 9C, isotropic etching is performed to the silicon nitride film 203 only by approximately 55 nm with wet etching using hot phosphoric acid, for example. This produces the distance of approximately 55 nm from the edge of the trench 204 to the silicon nitride film 203.

Note that isotropic etching to the silicon nitride film 203 may be performed by dry etching.

Figure 9D:
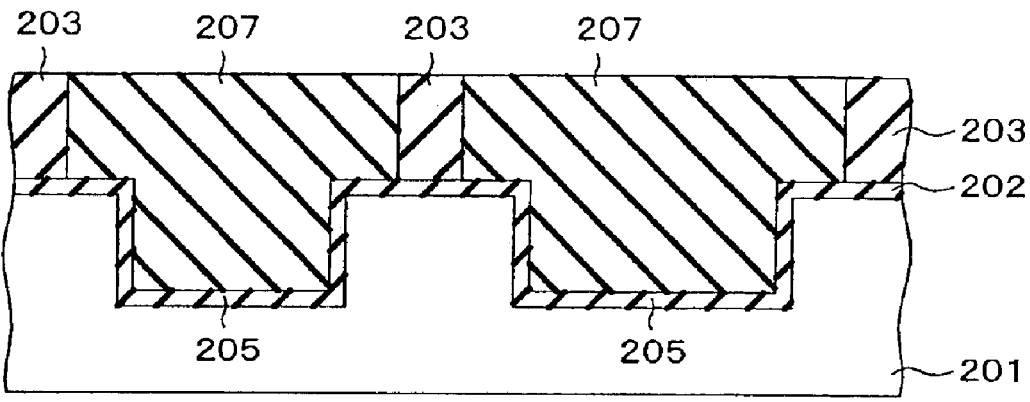

Next, as shown in FIG. 9D, $SiO_2$ is deposited by the high-density plasma CVD method over the entire upper surface of the silicon substrate 201 to form the silicon oxide film, and $SiO_2$ is embedded in the trenches 204. Subsequently, the silicon oxide film is polished until the silicon nitride film 203 exposes and the surface is made to be flat by the CMP method. Hereinafter, $SiO_2$ embedded in the trench 204 is referred to as an isolation film 207.

Figure 9E:
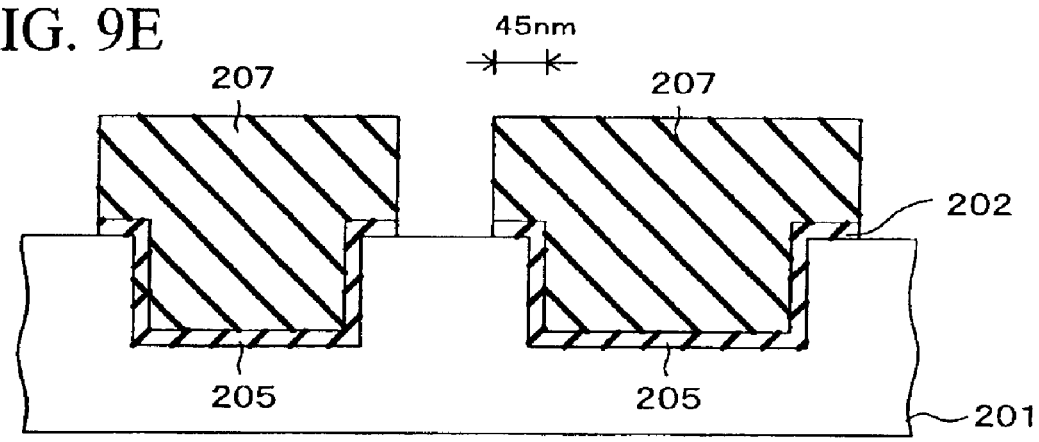

Next, as shown in FIG. 9E, the silicon nitride film 203 is removed by hot phosphoric acid. Subsequently, the silicon oxide film 202 between the isolation films 207 is removed by hydrofluoric acid processing. With this hydrofluoric acid processing, the isolation film 207 is entirely etched by approximately 10 nm and the offset quantity of the isolation film 207 becomes 45 nm.

Figure 9F:
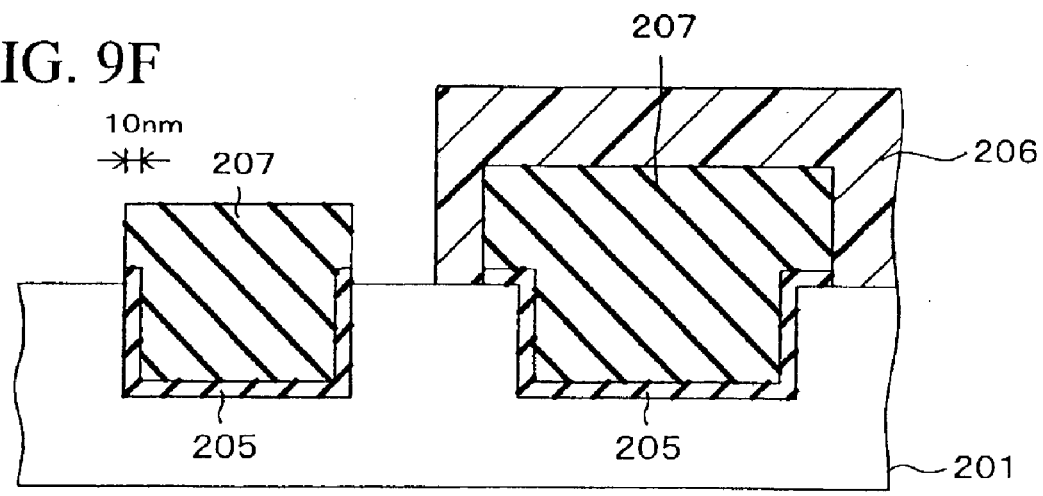

Next, after having coated photoresist over the entire upper surface of the silicon substrate 201, selective exposure and development processing are applied thereto, and the resist film 206 covering only the low-voltage operation section is formed as shown in FIG. 9F. Then, the isolation film 207 in the high-voltage operation section is etched by hydrofluoric acid approximately by 35 nm. Thus, the offset quantity of the isolation film 207 in the high-voltage operation section becomes approximately 10 nm, and the height thereof becomes lower than the isolation film 207 in the low-voltage operation section approximately by 35 nm.

Figure 9G:
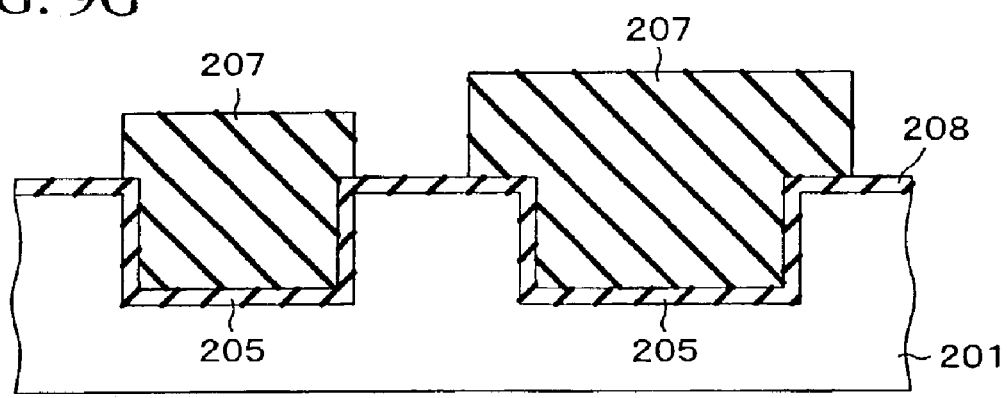

Subsequently, after having removed the resist film 206, thermal oxidation is performed to the surface of the silicon substrate 201 between the isolation films 207 to form a sacrifice oxide film 208 having the thickness of approximately 10 nm, as shown in FIG. 9G. Due to this thermal oxidation, the sacrifice oxide film 208 takes in impurities or portions with many defects on the surface of the substrate 201. Subsequently, ion implantation of conductive impurities for threshold adjustment, for example, is performed into the silicon substrate 201 via this sacrifice oxide film 208.

Figure 9H:
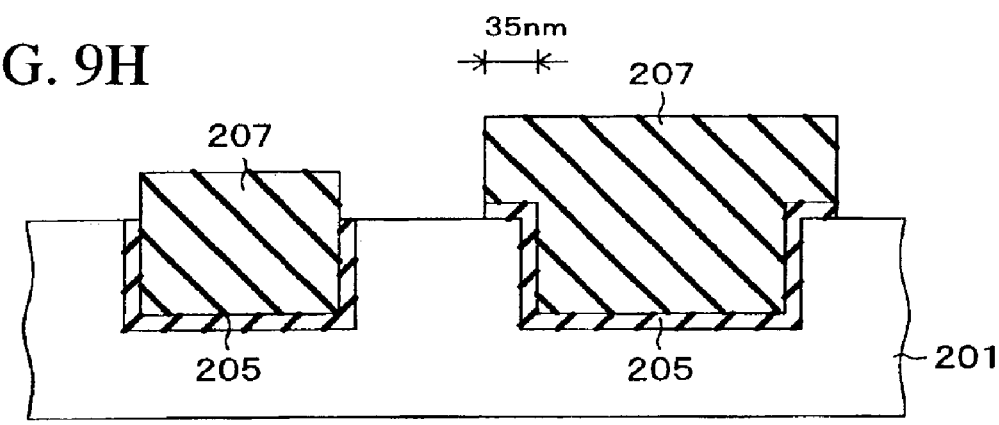

Next, as shown in FIG. 9H, the sacrifice oxide film 208 is removed by hydrofluoric acid. Due to the hydrofluoric acid processing, the offset quantity of the isolation film 207 in the high-voltage operation section becomes 0, and the offset quantity of the isolation film 207 in the low-voltage operation section becomes approximately 35 nm.

Figure 9I:
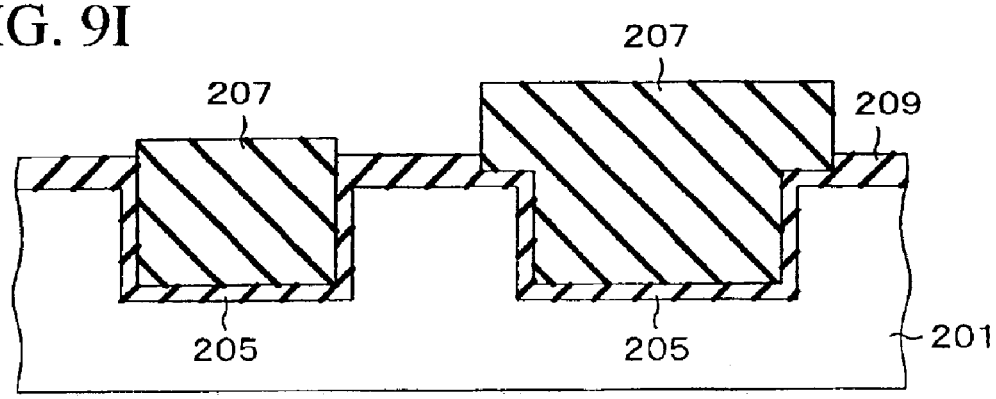

Next, as shown in FIG. 9I, thermal oxidation is performed to the surface of the silicon substrate 201 between the isolation films 207 to form a gate oxide film 209 having the thickness of approximately 35 nm.

Figure 9J:
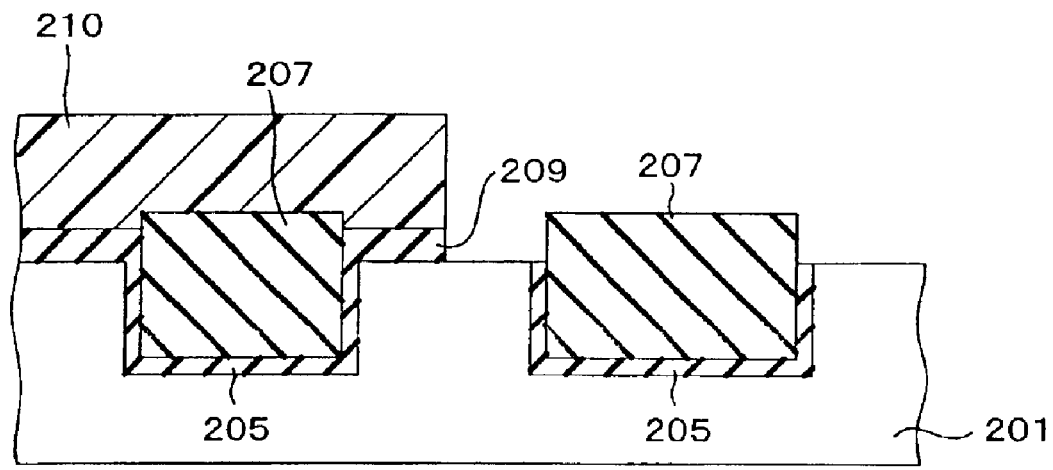

Next, photoresist is coated over the entire upper surface of the silicon substrate 201, selective exposure and development processing are applied thereto, and a resist film 210 covering only the high-voltage operation section is formed, as shown in FIG. 9J. Subsequently, the gate oxide film 209 in the low-voltage operation section is removed by hydrofluoric acid. At this point, since isotropic etching is performed to the isolation film 207 in the low-voltage operation section as well, the offset quantity becomes 0. Further, the height of the isolation film 207 in the low-voltage operation section becomes substantially the same as that of the isolation film 207 in the high-voltage operation section.

Figure 9K:
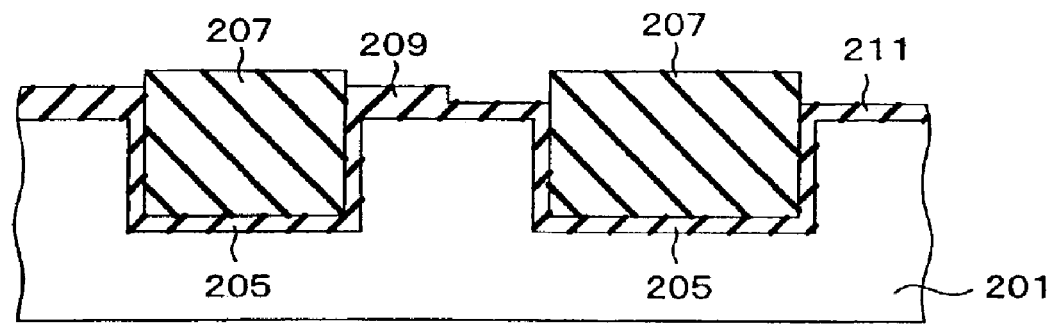

Next, after having removed the resist film 210, thermal oxidation is performed to the surface of the silicon substrate 201 to form a gate oxide film 211 having the thickness of approximately 8 nm, as shown in FIG. 9K. With such procedure, it is possible to form the gate oxide film 209 severally in the high-voltage operation section and the gate oxide film 211 in the low-voltage operation section in a desired thickness.

Hereinafter, when manufacturing the flash memory, the gate electrodes are formed on the gate oxide films (209, 211) as described in the first embodiment. In the memory cell section, the floating gates are formed on the gate oxide film 211, and the control gates are formed thereon via the silicon oxide film.

In this embodiment, it is also possible to individually set the offset quantity of the isolation films in the high-voltage operation section and the low-voltage operation section before the hydrofluoric acid processing. Therefore, the isolation film without a divot can be formed in the end and the isolation film can be prevented from extending on the element region.

(Third Embodiment)

FIGS. 10A to 10K are the sectional views showing in the order of process a method of forming the isolation film of the third embodiment according to the present invention. Note that the left side and the right side of the drawings in FIGS. 10A to 10K respectively show the high-voltage operation section and the low-voltage operation section.

Figure 10A:
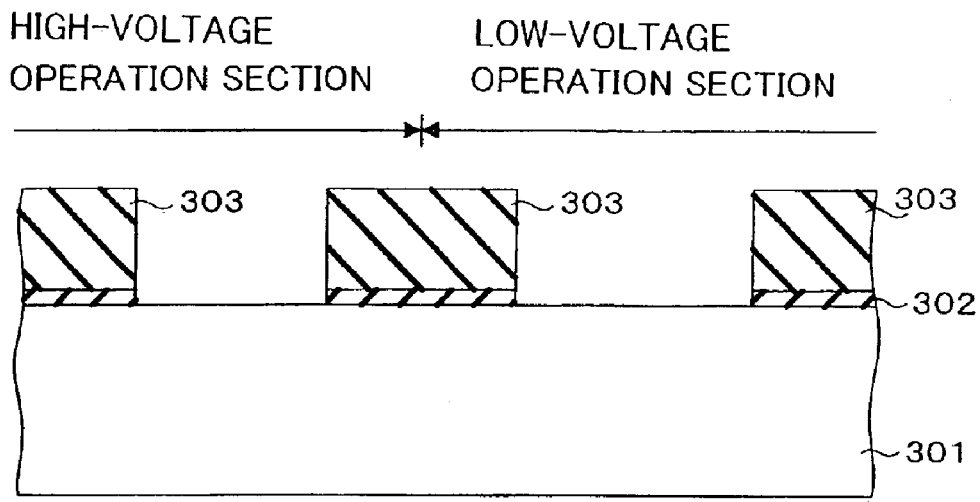
FIGS. 10A to 10K are views showing a method of forming the isolation film of the third embodiment according to the present invention.

First, as shown in FIG. 10A, a silicon oxide film 302 is formed in the thickness of approximately 10 nm on a silicon substrate 301 by the thermal oxidation method, and a silicon nitride film 303 is formed thereon in the thickness of 100 nm to 200 nm, for example, by the CVD method. Then, the silicon nitride film 303 and the silicon oxide film 302 in the element isolation region are removed by the photolithography method to partially expose the silicon substrate 301.

Figure 10B:
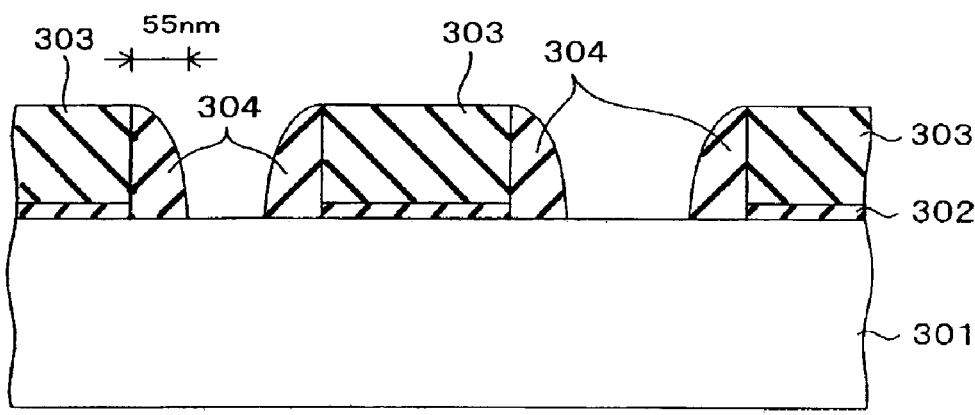

Next, as shown in FIG. 10B, sidewalls 304 are formed on the side portions of the silicon nitride film 302. Specifically, the silicon oxide film having the thickness of 60 nm is formed over the entire upper surface of the silicon substrate 301 by the CVD method. Then, anisotropic etching is performed to the silicon oxide film by RIE (Reactive Ion Etching) or the like, and the sidewalls 304 composed of silicon oxide film are formed on the side portions of the silicon nitride film 303. The width of the sidewall 304 (the width of the bottom portion of the sidewall) is approximately 55 nm.

Figure 10C:
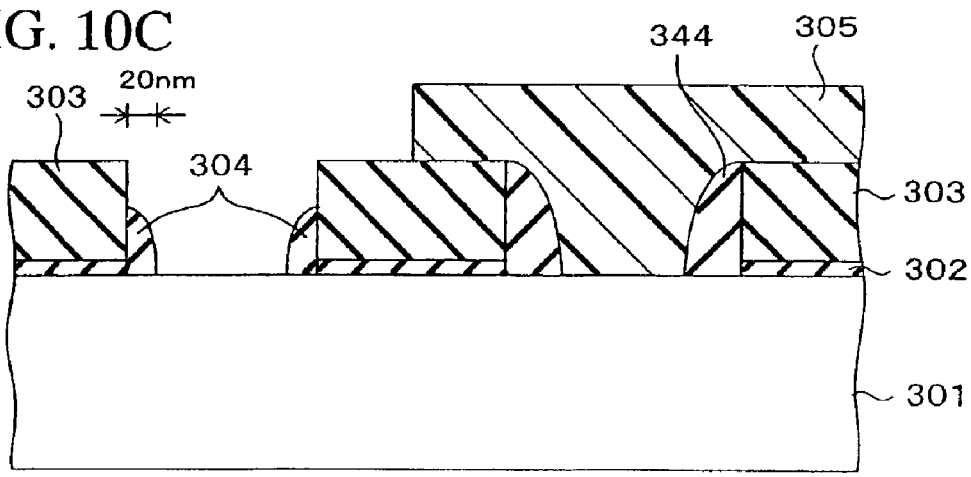

Next, after having coated photoresist over the entire upper surface of the silicon substrate 301, selective exposure and development processing are applied thereto, and a resist film 305 covering only the low-voltage operation section is formed as shown in FIG. 10C. Then, the sidewalls 304 in the high-voltage operation section are etched until the width becomes 20 nm. The resist film 305 is removed after the etching.

Figure 10D:
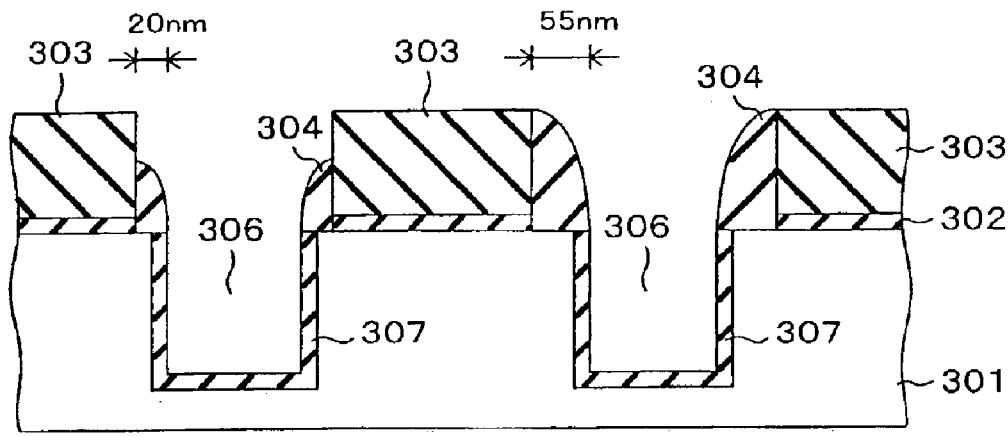

Next, as shown in FIG. 10D, the silicon substrate 301 is etched only by 300 nm using the silicon nitride film 303 and the sidewalls 304 as a mask to form trenches 306. Subsequently, thermal oxidation is performed to the wall surface and the bottom surface of the trenches 306, and a silicon oxide film 307 having the thickness of 1 nm to 3 nm is formed. The distance from the silicon nitride film 303 to the edge of the trench 306 is approximately 20 nm in the high-voltage operation section, and the distance from the silicon nitride film 303 to the edge of the trench 306 is approximately 55 nm in the low-voltage operation section.

Figure 10E:
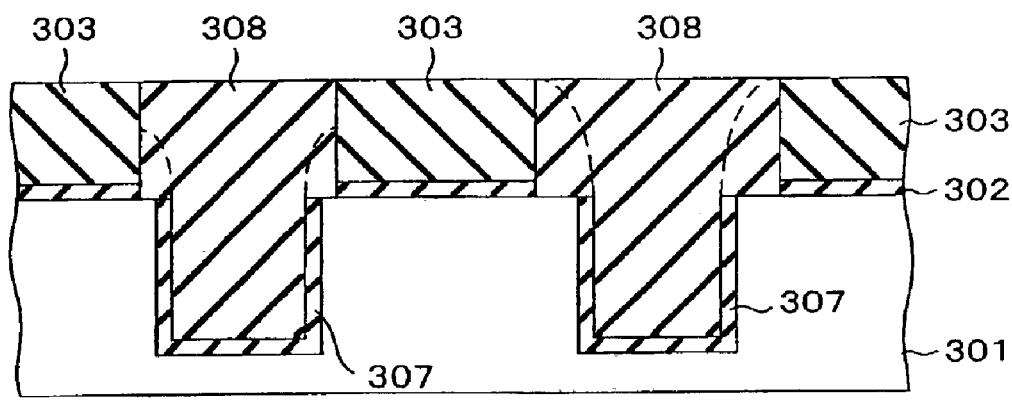

Next, as shown in FIG. 10E, $SiO_2$ is deposited over the entire upper surface of the silicon substrate 301 by the high-density plasma CVD method to form the silicon oxide film, and $SiO_2$ is embedded in the trenches 306. Then, the silicon oxide film is polished until the silicon nitride film 303 exposes and the surface is made to be flat by the CMP method. Hereinafter, $SiO_2$ embedded in the trenches 306 is referred to as an isolation film 308.

Figure 10F:
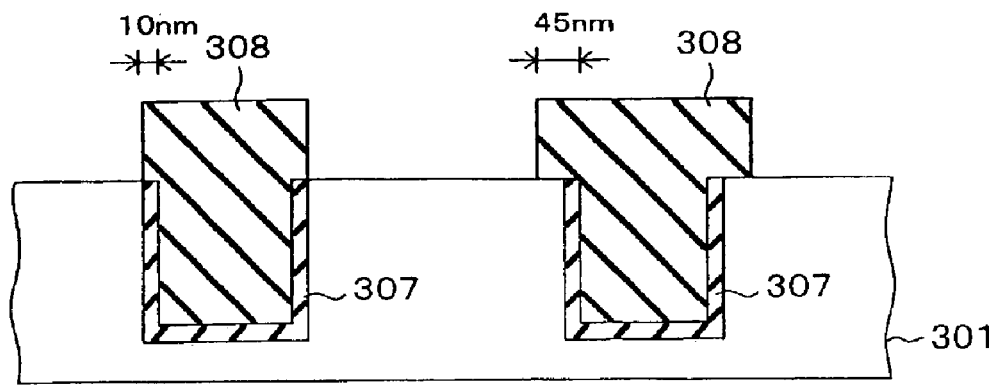

Subsequently, as shown in FIG. 10F, the silicon nitride film 303 is removed by hot phosphoric acid. Then, the silicon oxide film 302 is removed by hydrofluoric acid processing. At this point, since isotropic etching is performed to the isolation film 308 as well, the offset quantity of the isolation film 308 in the high-voltage operation section becomes approximately 10 nm, and the offset quantity of the isolation film 308 in the low-voltage operation section becomes approximately 45 nm. The heights of the isolation films 308 in the high-voltage operation section and the low-voltage operation section are the same.

Figure 10G:
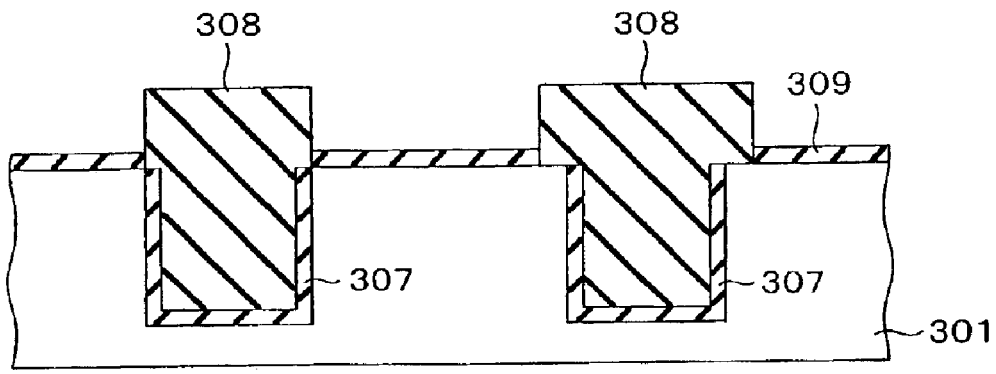

Next, as shown in FIG. 10G, thermal oxidation is performed to the surface of the silicon substrate 301 between the isolation films 308, and a sacrifice oxide film 309 having the thickness of approximately 10 nm is formed. At this point, the sacrifice oxide film 309 takes in impurities or portions with many defects on the surface of the substrate 301. Then, ion implantation of conductive impurities for threshold adjustment, for example, is performed into the silicon substrate 301 via the sacrifice oxide film 309.

Figure 10H:
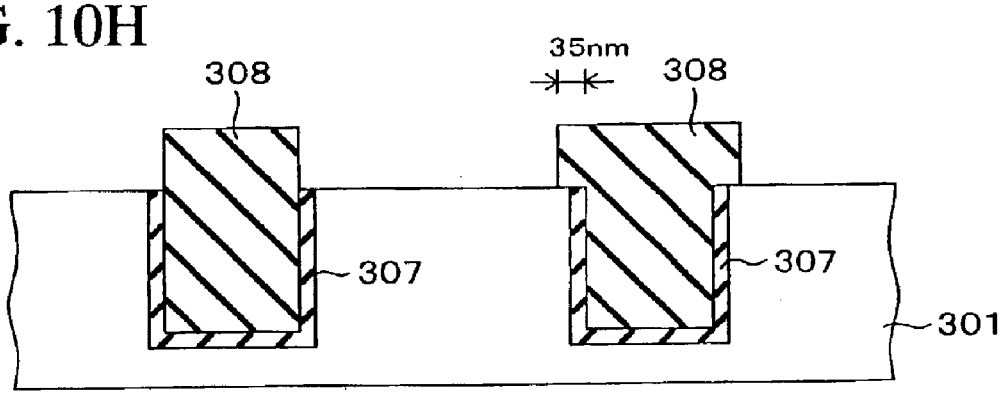

Next, as shown in FIG. 10H, the sacrifice oxide film 309 is removed by hydrofluoric acid. At this point, isotropic etching is performed to the isolation film 308 as well, the offset quantity of the isolation film 308 in the high-voltage operation section becomes 0, and the offset quantity of the isolation film 308 in the low-voltage operation section becomes approximately 35 nm.

Figure 10I:
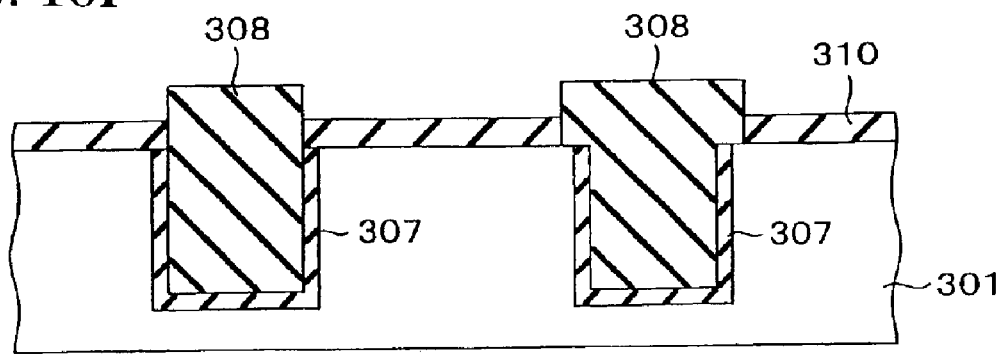

Next, as shown in FIG. 10I, thermal oxidation is performed to the surface of the silicon substrate 301 to form a gate oxide film 310 having the thickness of approximately 35 nm.

Figure 10J:
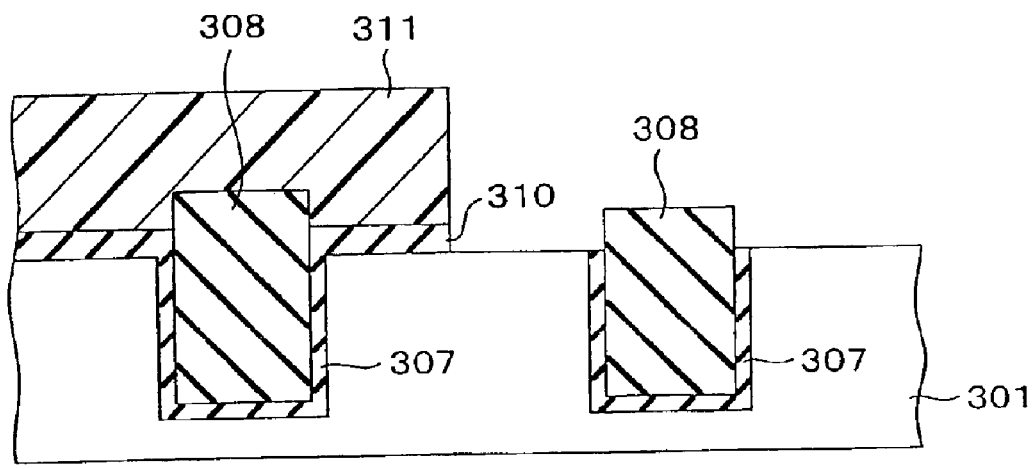

Next, photoresist is coated over the entire upper surface of the silicon substrate 301, selective exposure and development processing are applied thereto, and a resist film 311 covering only the high-voltage operation section is formed, as shown in FIG. 10J. Subsequently, the silicon oxide film 310 in the low-voltage operation section is removed by hydrofluoric acid. At this point, since isotropic etching is performed to the isolation film 308 in the high-voltage operation section as well, the offset quantity becomes 0. Further, the height of the isolation film 308 in the high-voltage operation section becomes lower than the isolation film 308 in the low-voltage operation section by approximately 35 nm.

Figure 10K:
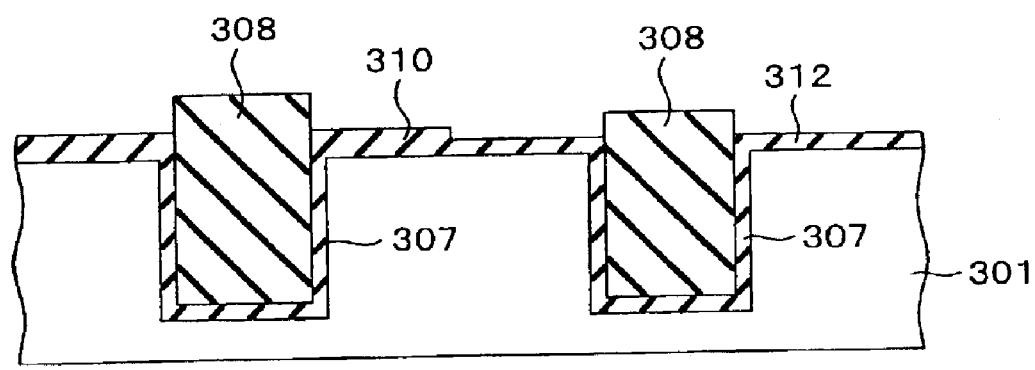

Next, after having removed the resist film 311, thermal oxidation is performed to the surface of the silicon substrate 301 to form a gate oxide film 312 having the thickness of approximately 8 nm, as shown in FIG. 10K. With such procedure, it is possible to form the gate oxide film 310 severally in the high-voltage operation section and the gate oxide film 312 in the low-voltage operation section in a desired thickness.

Hereinafter, when manufacturing the flash memory, the gate electrodes are formed on the gate oxide films (310, 312) as described in the first embodiment. In the memory cell section, the floating gates are formed on the gate oxide film 312, and the control gates are formed thereon via the silicon oxide film.

In this embodiment, it is also possible to individually set the offset quantity of the isolation films in the high-voltage operation section and the low-voltage operation section before the hydrofluoric acid processing. Therefore, the isolation film without a divot can be formed in the end and the isolation film can be prevented from extending on the element region.

(Fourth Embodiment)

FIGS. 11A to 11K are the sectional views showing in the order of process a method of forming the isolation film of the fourth embodiment according to the present invention. Note that the left side and the right side of the drawings in FIGS. 11A to 11K respectively show the high-voltage operation section and the low-voltage operation section.

Figure 11A:
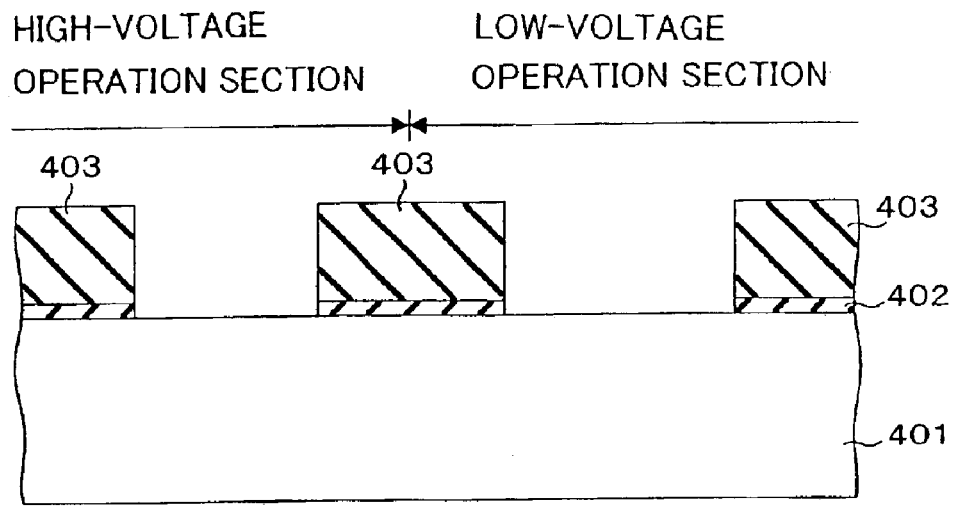
FIGS. 11A to 11K are views showing a method of forming the isolation film of the fourth embodiment according to the present invention.
Figure 11B:
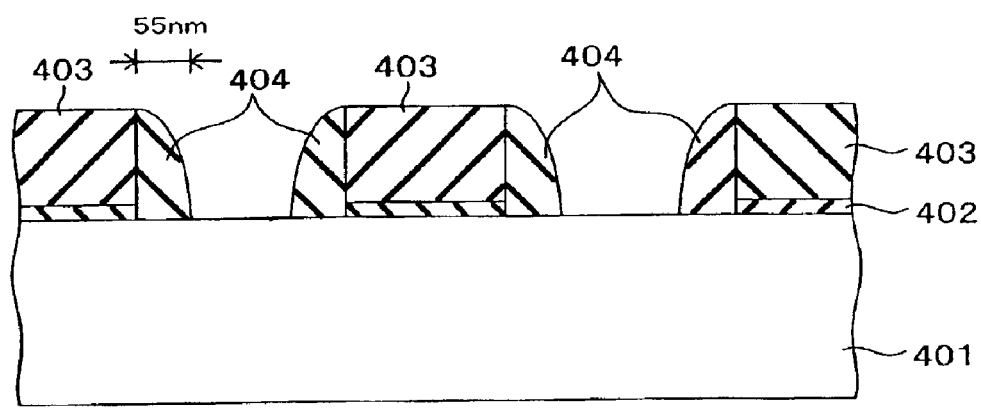

First, as shown in FIG. 11A, a silicon oxide film 402 is formed in the thickness of approximately 10 nm on a silicon substrate 401 by the thermal oxidation method, and a silicon nitride film 403 is formed thereon in the thickness of 100 nm to 200 nm, for example, by the CVD method. Then, the silicon nitride film 403 and the silicon oxide film 402 in the isolation region are removed by the photolithography method to partially expose the silicon substrate 401.

Next, the silicon oxide film having the thickness of 60 nm is formed over the entire upper surface of the silicon substrate 401. Then, the silicon oxide film is etched in a vertical direction by an RIE method or the like, and sidewalls 404 composed of silicon oxide film are formed on the side portions of the silicon nitride film 403. The width of the sidewall 404 (the width of the bottom portion of the sidewall) is approximately 55 nm.

Figure 11C:
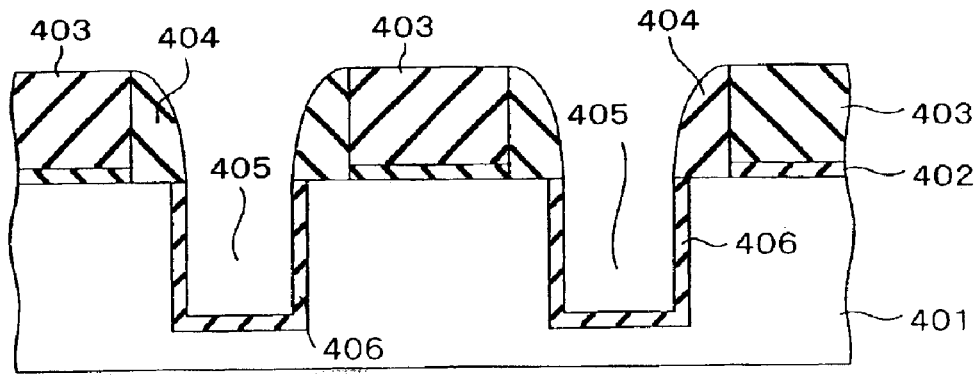

Next, as shown in FIG. 11C, the silicon substrate 401 is etched only by 300 nm using the silicon nitride film 403 and the sidewalls 404 as a mask to form trenches 405. Subsequently, thermal oxidation is performed to the wall surface and the bottom surface of the trenches 405, and a silicon oxide film 406 having the thickness of 1 nm to 3 nm is formed.

Figure 11D:
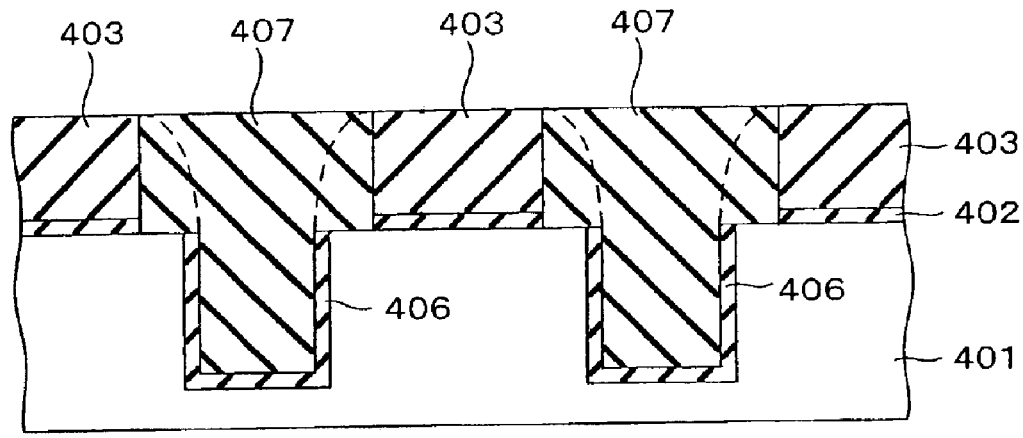

Next, as shown in FIG. 11D, $SiO_2$ is deposited over the entire upper surface of the silicon substrate 401 by the high-density plasma CVD method to form the silicon oxide film. Then, the silicon oxide film is polished until the silicon nitride film 403 exposes and the surface is made to be flat by the CMP method. Hereinafter, $SiO_2$ embedded in the trenches 405 is referred to as an isolation film 407.

Figure 11E:
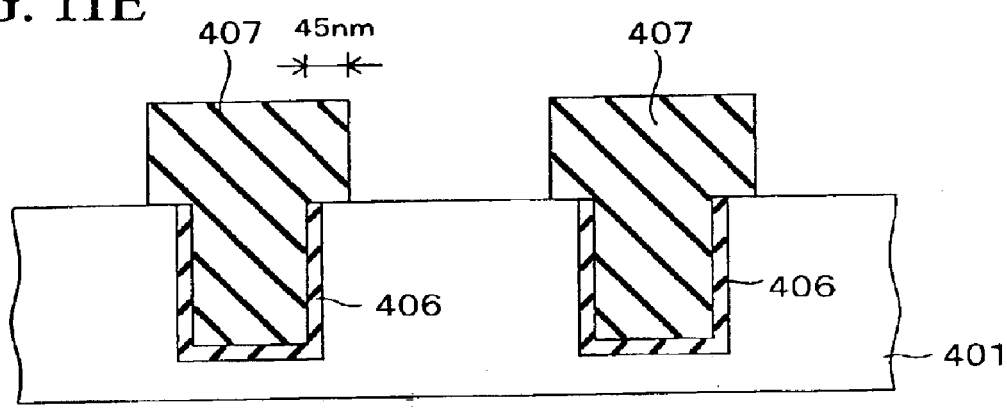

Subsequently, as shown in FIG. 11E, the silicon nitride film 403 is removed by hot phosphoric acid. Then, the silicon oxide film 402 is removed by hydrofluoric acid processing. At this point, since isotropic etching is performed to the isolation film 407 as well, the offset quantity of the isolation film 407 becomes approximately 45 nm.

Figure 11F:
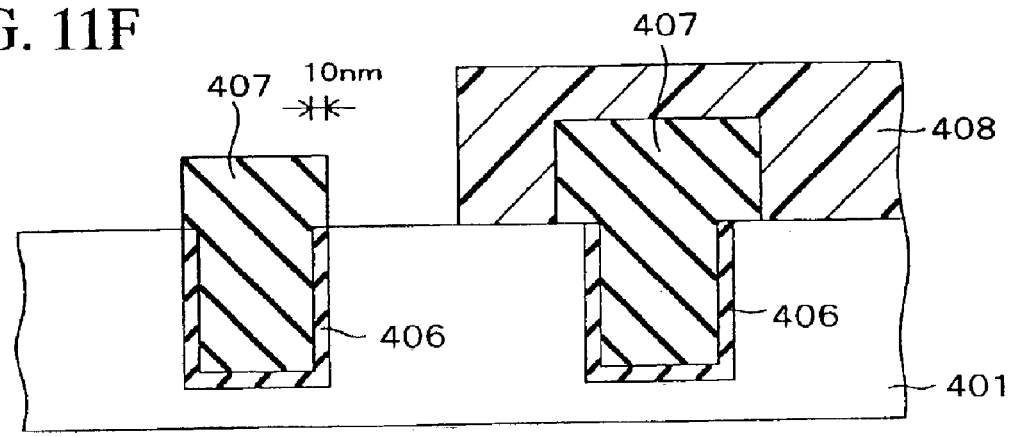

Next, as shown in FIG. 11F, photoresist is coated over the entire upper surface of the silicon substrate 401, selective exposure and development processing are applied thereto, and a resist film 408 covering only the low-voltage operation section is formed. Subsequently, isotropic etching is performed to the isolation film 407 in the high-voltage operation section only by approximately 35 nm with hydrofluoric acid. Thus, the offset quantity of the isolation film 407 in the high-voltage operation section becomes approximately 10 nm.

Figure 11G:
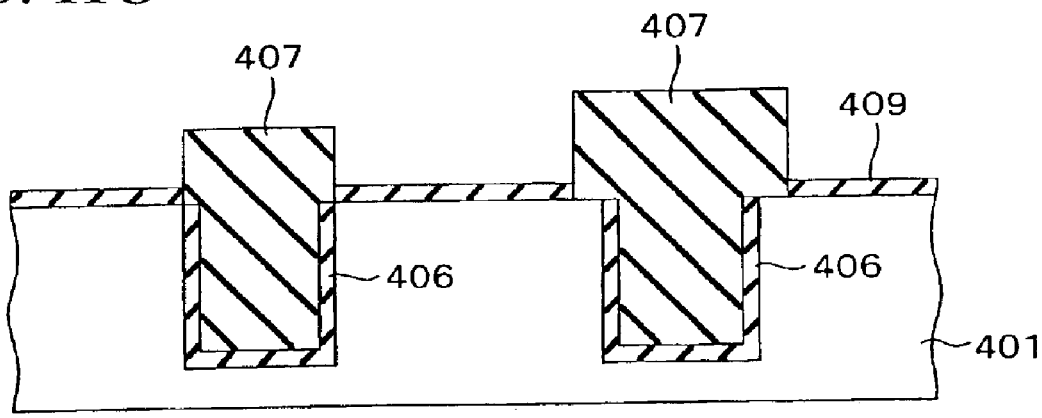

Next, as shown in FIG. 11G, thermal oxidation is performed to the surface of the silicon substrate 401 after having removed the resist film 408, and a sacrifice oxide film 409 having the thickness of approximately 10 nm is formed. At this point, the sacrifice oxide film 409 takes in impurities or portions with many defects on the surface of the substrate 401. Then, conductive impurities for threshold adjustment, for example, are introduced into the silicon substrate 401 via the sacrifice oxide film 409.

Figure 11H:
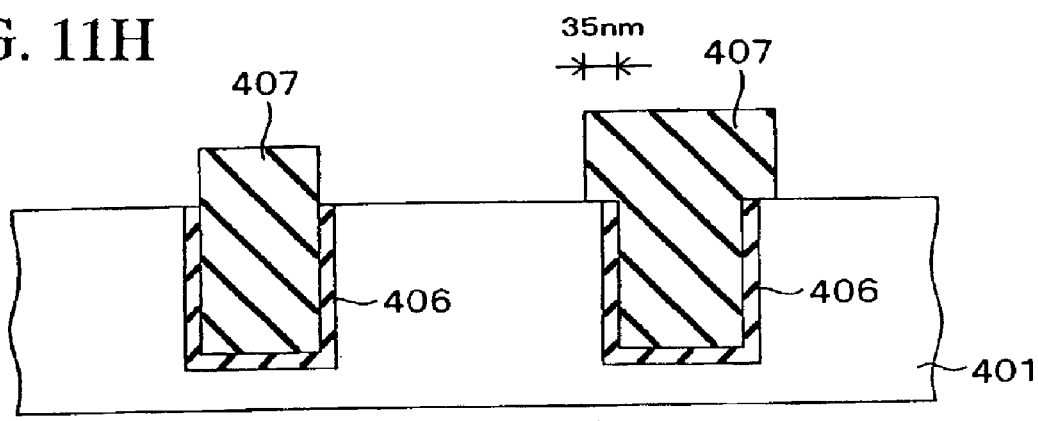

Next, as shown in FIG. 11H, the sacrifice oxide film 409 is removed by hydrofluoric acid. At this point, since isotropic etching is performed to the isolation film 407 as well, the offset quantity of the isolation film 407 in the high-voltage operation section becomes 0, and the offset quantity of the isolation film 407 in the low-voltage operation section becomes approximately 35 nm.

Figure 11I:
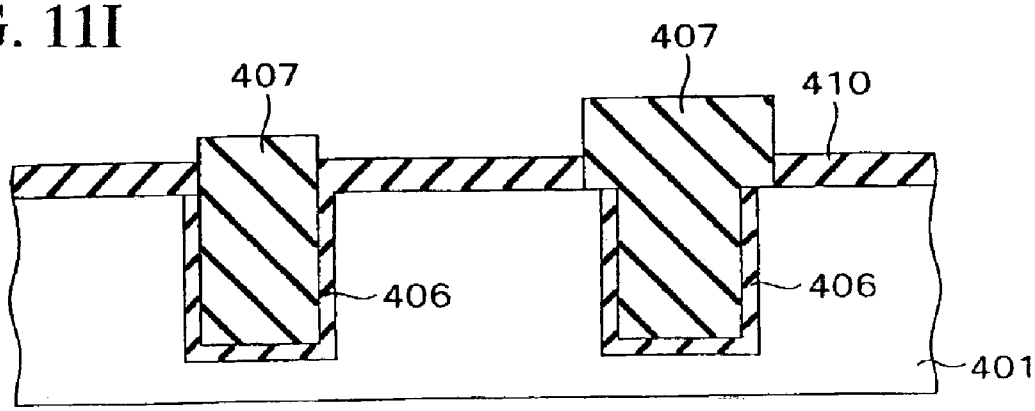

Next, as shown in FIG. 11I, thermal oxidation is performed to the surface of the silicon substrate 401 to form a gate oxide film 410 having the thickness of approximately 35 nm.

Figure 11J:
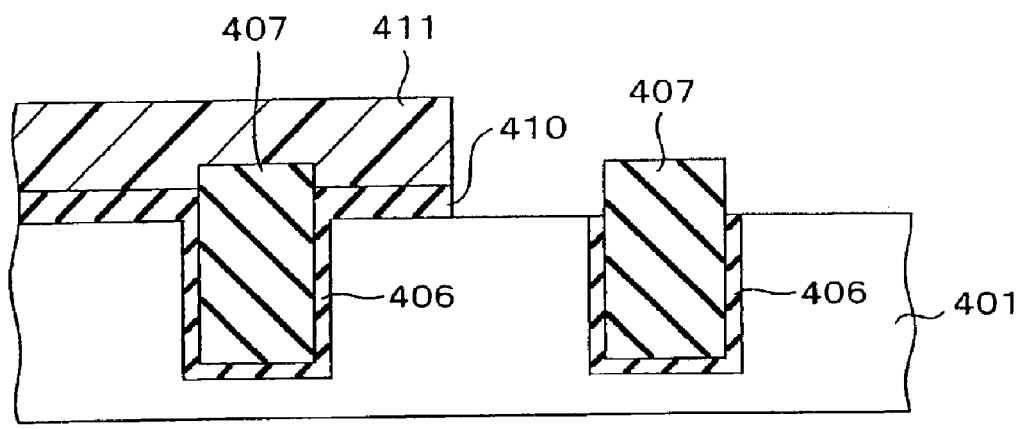

Next, as shown in FIG. 11J, photoresist is coated over the entire upper surface of the silicon substrate 401, selective exposure and development processing are applied thereto, and a resist film 411 covering only the high-voltage operation section is formed. Subsequently, the gate oxide film 410 in the low-voltage operation section is removed by hydrofluoric acid. At this point, since isotropic etching is performed to the isolation film 407 in the low-voltage operation section, the offset quantity becomes 0. Further, the heights of the isolation films 407 in the high-voltage operation section and the low-voltage operation section become the same.

Figure 11K:
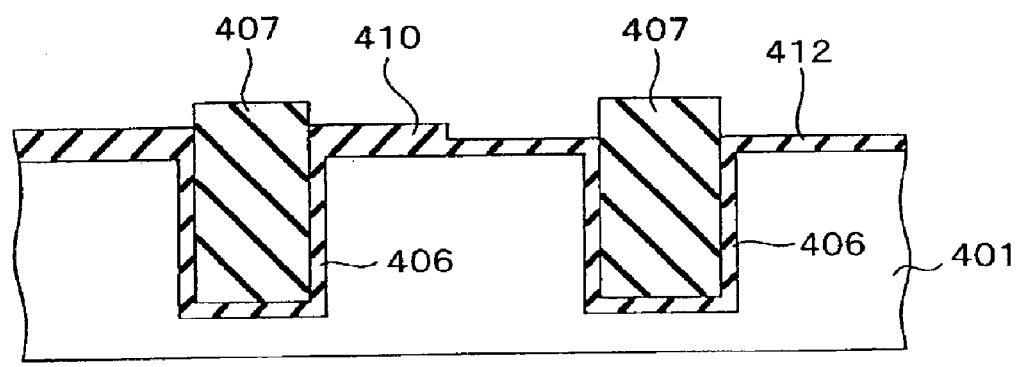

Next, as shown in FIG. 11K, thermal oxidation is performed to the surface of the silicon substrate 401 after having removed the resist film 411, and a gate oxide film 412 having the thickness of approximately 8 nm is formed. With such procedure, it is possible to form the gate oxide film 410 severally in the high-voltage operation section and the gate oxide film 412 in the low-voltage operation section in a desired thickness.

Hereinafter, when manufacturing the flash memory, the gate electrodes are formed on the gate oxide film (410, 412) as described in the first embodiment. In the memory cell section, the floating gates are formed on the gate oxide film 412, and the control gates are formed thereon via the silicon oxide film.

In this embodiment, it is also possible to individually set the offset quantity of the isolation films in the high-voltage operation section and the low-voltage operation section before the hydrofluoric acid processing. Therefore, the isolation film without a divot can be formed in the end and the isolation film can be prevented from extending on the element region.

(Fifth Embodiment)

FIGS. 12A to 12L are the sectional views showing in the order of process a method of forming the isolation film of the fifth embodiment according to the present invention. Note that the left side and the right side of the drawings in FIGS. 12A to 12L respectively show the high-voltage operation section and the low-voltage operation section.

Figure 12A:
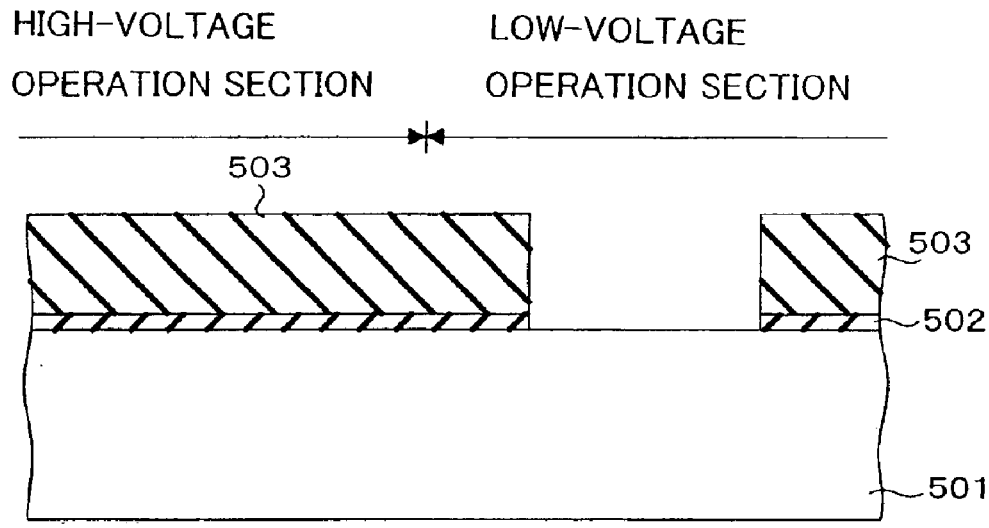
FIGS. 12A to 12L are views showing a method of forming the isolation film of the fifth embodiment according to the present invention.

First, as shown in FIG. 12A, a silicon oxide film 502 is formed in the thickness of approximately 10 nm on a silicon substrate 501 by the thermal oxidation method, and a silicon nitride film 503 is formed thereon in the thickness of 100 nm to 200 nm, for example, by the CVD method. Then, the silicon nitride film 503 and the silicon oxide film 502 in the element isolation region in the low-voltage operation section are removed by the photolithography method to partially expose the silicon substrate 501.

Figure 12B:
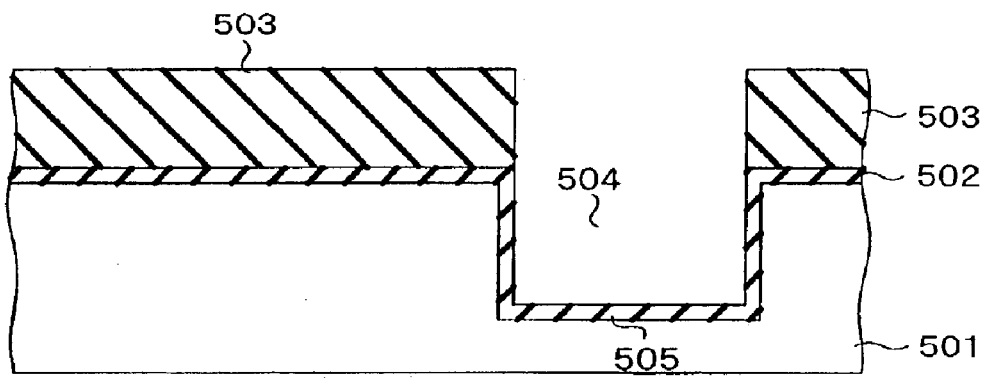

Next, as shown in FIG. 12B, the silicon substrate 501 is etched only by 300 nm using the silicon nitride film 503 as a mask to form a trench 504. Subsequently, thermal oxidation is performed to the wall surface and the bottom surface of the trench 504, and a silicon oxide film 505 having the thickness of 1 nm to 3 nm is formed. This silicon oxide film 505 is formed to protect the silicon substrate 501 when the silicon nitride film 503 is etched in the subsequent process.

Figure 12C:
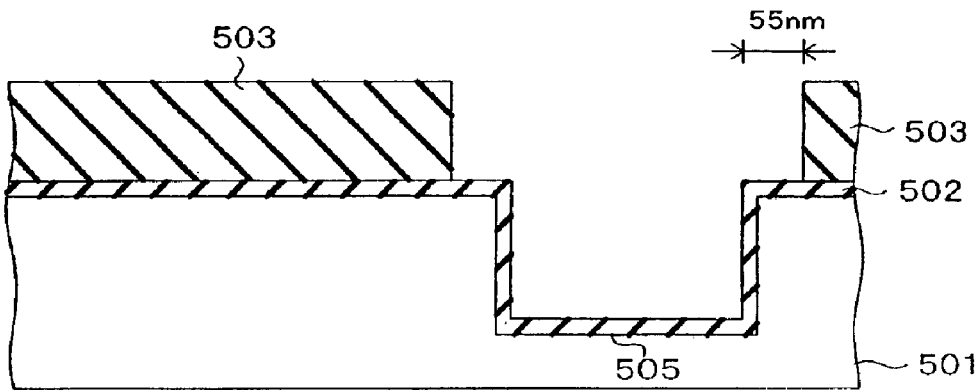

Next, as shown in FIG. 12C, isotropic etching is performed to the silicon nitride film 503 only by approximately 55 nm with wet etching using hot phosphoric acid, for example. This produces the distance of approximately 55 nm from the edge of the trench 504 to the silicon nitride film 503. Note that isotropic etching can be performed to the silicon nitride film 503 by dry etching when etching conditions are properly selected.

Figure 12D:
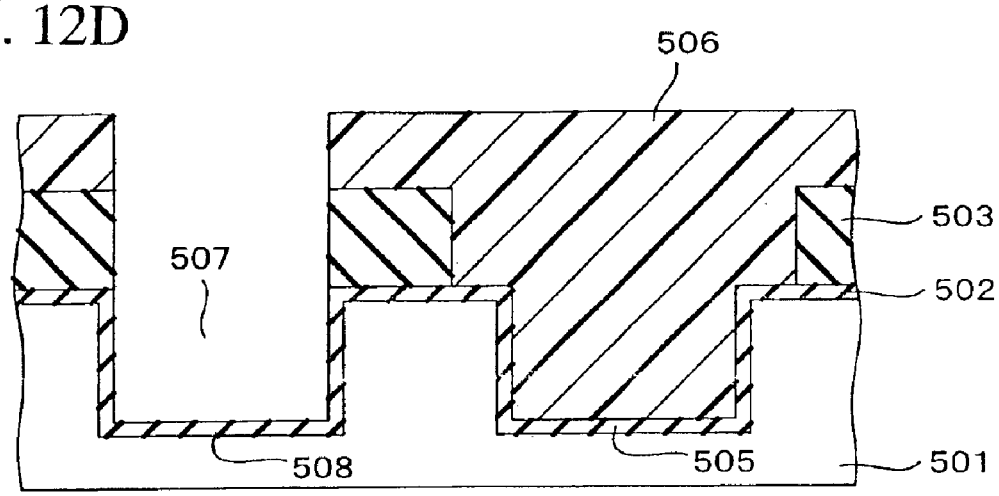

Next, as shown in FIG. 12D, after having coated photoresist over the entire upper surface of the silicon substrate 501, selective exposure and development processing are applied thereto, and a resist film 506, where a portion corresponding to the element isolation region in the high-voltage operation section is open, is formed. Then, the silicon nitride film 503 and the silicon oxide film 502 are etched using the resist film 506 as a mask, and the silicon substrate 501 is further etched only by 300 nm to form a trench 507. Subsequently, thermal oxidation is performed to the wall surface and the bottom surface of the trench 507 to form a silicon oxide film 508.

Figure 12E:
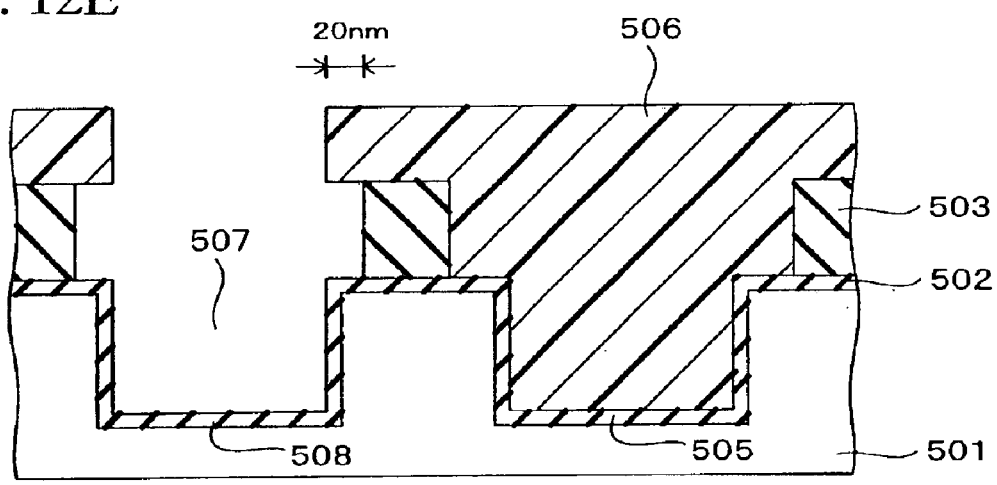

Next, as shown in FIG. 12E, the silicon nitride film 503 in the high-voltage operation section is etched in horizontal directions by approximately 20 nm with wet etching using hot phosphoric acid, for example. Note that this process can be performed by dry etching as well.

Figure 12F:
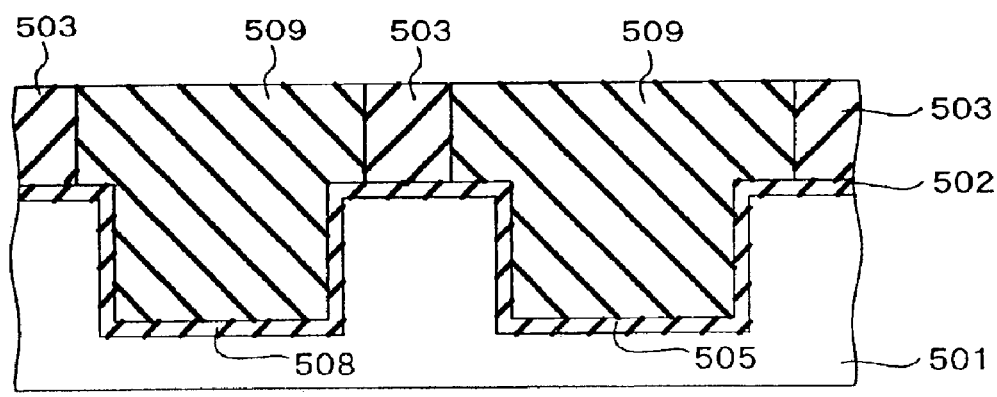

Next, after having removed the resist film 506, $SiO_2$ is deposited over the entire upper surface of the silicon substrate 501 by the high-density plasma CVD method to form the silicon oxide film, and $SiO_2$ is embedded in the trenches (504, 507). Then, as shown in FIG. 12F, the silicon oxide film is polished until the silicon nitride film 503 exposes and the surface is made to be flat by the CMP method. Hereinafter, $SiO_2$ embedded in the trenches (504, 507) is referred to as an isolation film 509.

Figure 12G:
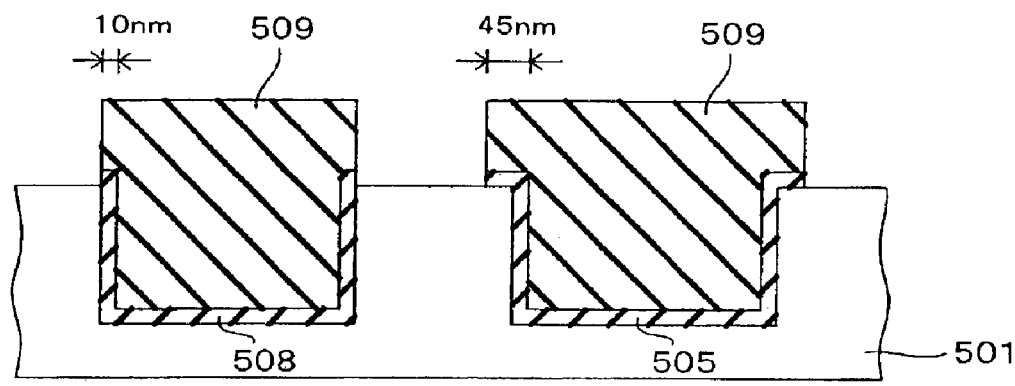

Subsequently, as shown in FIG. 12G, the silicon nitride film 503 is removed by hot phosphoric acid. Then, the silicon oxide film 502 between the isolation films 509 is removed by hydrofluoric acid processing. At this point, isotropic etching is performed to the isolation films 509 as well, the offset quantity of the isolation film 509 in the high-voltage operation section becomes approximately 10 nm, and the offset quantity of the isolation film 509 in the low-voltage operation section becomes approximately 45 nm.

Figure 12H:
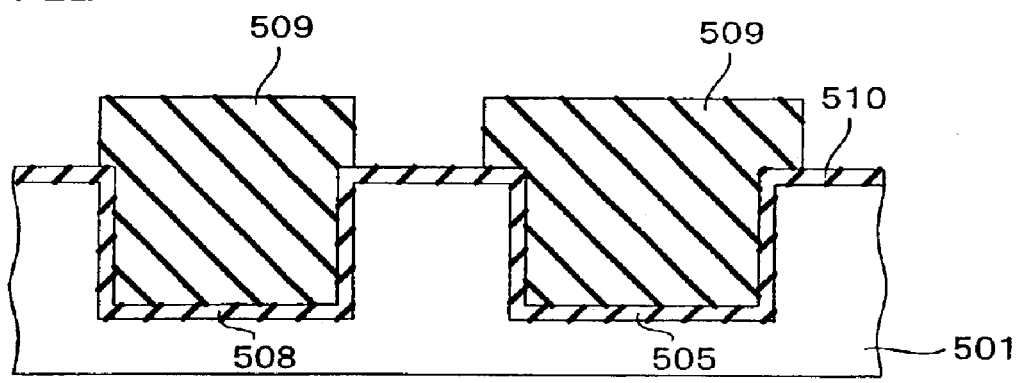

Next, as shown in FIG. 12H, thermal oxidation is performed to the surface of the silicon substrate 501 between the isolation films 509, and a sacrifice oxide film 510 having the thickness of approximately 10 nm is formed. At this point, the sacrifice oxide film 510 takes in impurities or portions with many defects on the surface of the substrate 501. Then, ion implantation of conductive impurities for threshold adjustment, for example, is performed into the silicon substrate 501 via the sacrifice oxide film 510.

Figure 12I:
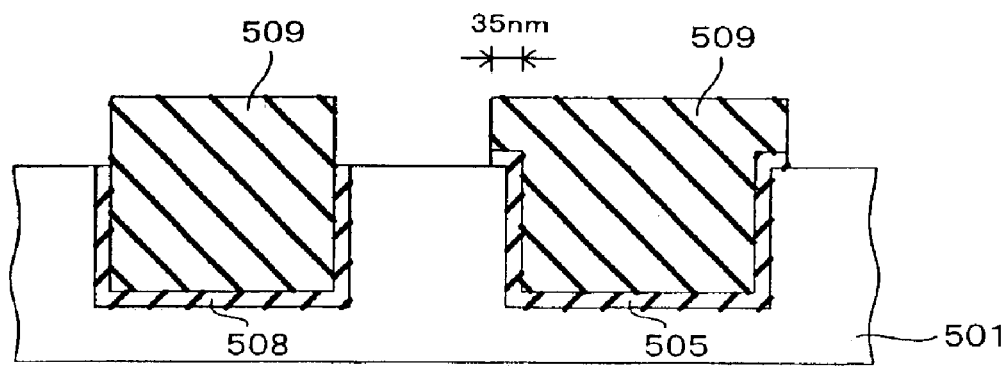

Next, as shown in FIG. 12I, the sacrifice oxide film 510 is removed by hydrofluoric acid. At this point, isotropic etching is performed to the isolation films 509 as well, the offset quantity of the isolation film 509 in the high-voltage operation section is 0, and the offset quantity of the isolation film 509 in the low-voltage operation section is approximately 35 nm.

Figure 12J:
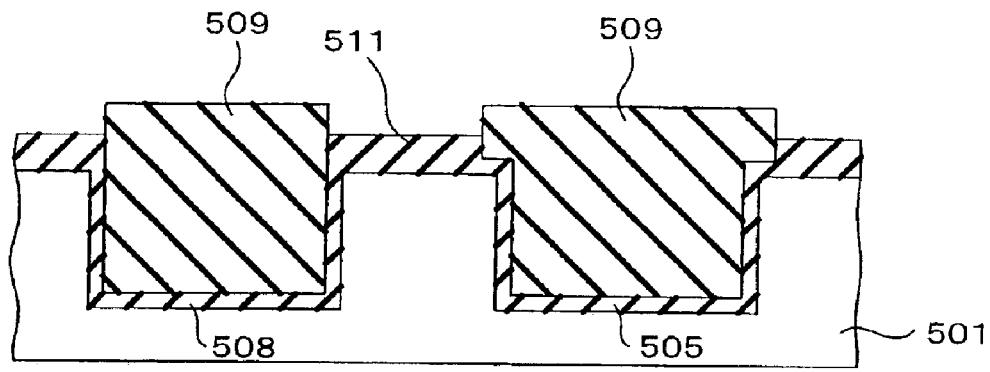

Next, as shown in FIG. 12J, thermal oxidation is performed to the surface of the silicon substrate 501 to form a gate oxide film 511 having the thickness of approximately 35 nm.

Figure 12K:
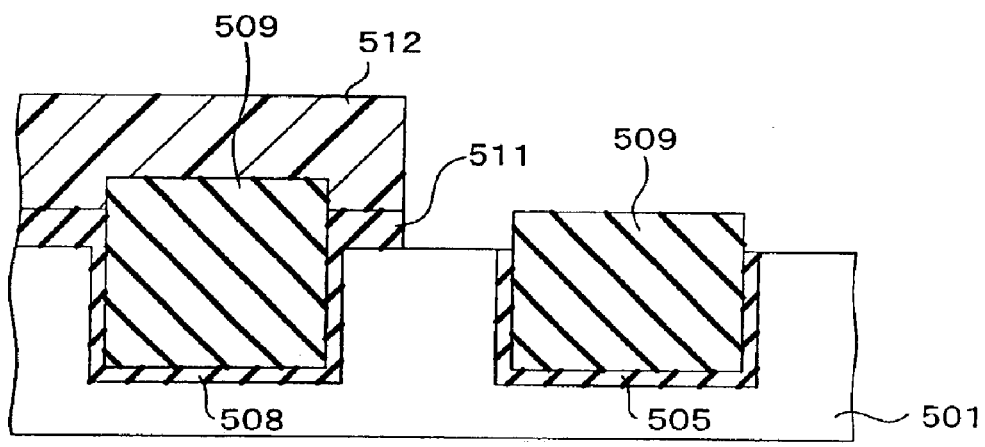

Next, as shown in FIG. 12K, photoresist is coated over the entire upper surface of the silicon substrate 501, selective exposure and development processing are applied thereto, and a resist film 512 covering only the high-voltage operation section is formed. Subsequently, the gate oxide film 511 in the low-voltage operation section is removed by applying hydrofluoric acid processing using the resist film 512 as a mask. At this point, isotropic etching is performed to the isolation film 509 in the low-voltage operation section, which results in the offset quantity of 0 and a reduced height.

Figure 12L:
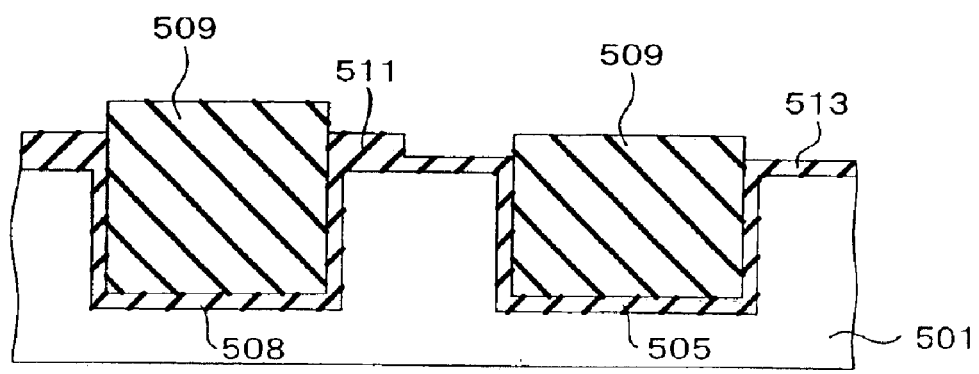

Next, as shown in FIG. 12L, thermal oxidation is performed to the surface of the silicon substrate 501 after having removed the resist film 512, and a gate oxide film 513 having the thickness of approximately 8 nm is formed. With such procedure, it is possible to form the gate oxide films (511. 513) severally in the high-voltage operation section and the low-voltage operation section in a desired thickness. Note that the isolation film 509 in the high-voltage operation section is higher than the isolation film 509 in the low-voltage operation section by approximately 35 nm.

Hereinafter, when manufacturing the flash memory, the gate electrodes are formed on the gate oxide films (511, 513) as described in the first embodiment. In the memory cell section, the floating gates are formed on the gate oxide film 513, and the control gates are formed thereon via the silicon oxide film.

In this embodiment, it is also possible to individually set the offset quantity of the isolation films in the high-voltage operation section and the low-voltage operation section before the hydrofluoric acid processing. Therefore, the isolation film without a divot can be formed in the end and the isolation film can be prevented from extending on the element region.

What is claimed is:

1. A method of forming an isolation film, comprising the steps of:

forming a first silicon oxide film on a semiconductor substrate;

forming a silicon nitride film on said first silicon oxide film;

performing patterning to said silicon nitride film;

etching said first silicon oxide film and said semiconductor substrate using said silicon nitride film as a mask and forming trenches severally in a first region and a second region of said semiconductor substrate;

a first isotropic etching in which isotropic etching is performed to said silicon nitride film;

a second isotropic etching in which said first region is protected by a first resist film and isotropic etching is performed to said silicon nitride film in said second region;

removing said first resist film;

depositing silicon oxide over the entire upper surface of said semiconductor substrate and forming a second silicon oxide film;

removing said second silicon oxide film until said silicon nitride film exposes;

removing said silicon nitride film;

oxidizing the surface of said semiconductor substrate and forming a third silicon oxide film;

a third isotropic etching in which said third silicon oxide film is removed and performing isotropic etching to said remaining second silicon oxide film;

oxidizing the surface of said semiconductor substrate and forming a fourth silicon oxide film;

a fourth isotropic etching in which said first region is protected by a second resist film, said fourth silicon oxide film in said second region is removed, and isotropic etching is performed to said second oxide film in said second region;

removing said second resist film; and oxidizing the surface of said semiconductor substrate and forming a fifth silicon oxide film.

2. The method of forming an isolation film according to claim 1, wherein conductive impurities are implanted into said semiconductor substrate via said third silicon oxide film.

3. The method of forming an isolation film according to claim 1, wherein the step of removing said second silicon oxide film until said silicon nitride film exposes is executed by a chemical mechanical polishing method.

4. The method of forming an isolation film according to claim 1, wherein an etching quantity in said first isotropic etching step is determined based on the total of the thickness of said first silicon oxide film and the thickness of said third silicon oxide film.

5. The method of forming an isolation film according to claim 1, wherein an etching quantity in said second isotropic etching step is determined based on the thickness of said fifth silicon oxide film.

6. A method of forming an isolation film, comprising the steps of:

forming a first silicon oxide film on a semiconductor substrate;

forming a silicon nitride film on said first silicon oxide film;

performing patterning to said silicon nitride film;

etching said first silicon oxide film and said semiconductor substrate using said silicon nitride film as a mask and forming trenches severally in a first region and a second region of said semiconductor substrate;

a first isotropic etching in which isotropic etching is performed to said silicon nitride film;

depositing silicon oxide over the entire upper surface of said semiconductor substrate and forming a second silicon oxide film;

removing said second silicon oxide film until said silicon nitride film exposes;

removing said silicon nitride film;

a second isotropic etching in which said second region is protected by a first resist film and isotropic etching is performed to said second silicon oxide film in said first region;

removing said first resist film;

oxidizing the surface of said semiconductor substrate and forming a third silicon oxide film;

a third isotropic etching in which said third silicon oxide film is removed and performing isotropic etching to remaining said second silicon oxide film;

oxidizing the surface of said semiconductor substrate and forming a fourth silicon oxide film;

a fourth isotropic etching in which said first region is protected by a second resist film, said fourth silicon oxide film in said second region is removed, and isotropic etching is performed to said second oxide film in said second region;

removing said second resist film; and oxidizing the surface of said semiconductor substrate and forming a fifth silicon oxide film.

7. The method of forming an isolation film according to claim 6, wherein conductive impurities are implanted into said semiconductor substrate via said third silicon oxide film.

8. The method of forming an isolation film according to claim 6, wherein the step of removing said second silicon oxide film until said silicon nitride film exposes is executed by a chemical mechanical polishing method.

9. The method of forming an isolation film according to claim 6, wherein an etching quantity in said first isotropic etching step is determined based on the total of the thickness of said first silicon oxide film, the thickness of said third silicon oxide film, and the thickness of said fourth silicon oxide film.

10. The method of forming an isolation film according to claim 6, wherein an etching quantity in said second isotropic etching step is determined based on the thickness of said third silicon oxide film.

11. A method of forming an isolation film, comprising the steps of:

forming a first silicon oxide film on a semiconductor substrate;

forming a silicon nitride film on said first silicon oxide film;

performing patterning to said silicon nitride film and said first silicon oxide film and forming opening portions at which said semiconductor substrate exposes severally in a first region and a second region;

forming sidewalls composed of silicon oxide on the side portions of said silicon nitride film;

a first isotropic etching in which said second region of said semiconductor substrate is protected by a first resist film and isotropic etching is performed to said sidewalls in said first region;

removing said first resist film;

etching said semiconductor substrate using said silicon nitride film and said sidewalls as a mask and forming trenches severally in said first region and said second region;

depositing silicon oxide over the entire upper surface of said semiconductor substrate and forming a second silicon oxide film;

removing said second silicon oxide film until said silicon nitride film exposes;

removing said silicon nitride film;

a second isotropic etching in which said first silicon oxide film is removed and isotropic etching is performed to remaining said second silicon oxide film;

oxidizing the surface of said semiconductor substrate and forming a third silicon oxide film;

a third isotropic etching in which said third silicon oxide film is removed and performing isotropic etching to said second silicon oxide film;

oxidizing the surface of said semiconductor substrate and forming a fourth silicon oxide film;

a fourth isotropic etching in which said first region is protected by a second resist film, said fourth silicon oxide film in said second region is removed, and isotropic etching is performed to said second oxide film in said second region;

removing said second resist film; and oxidizing the surface of said semiconductor substrate and forming a fifth silicon oxide film.

12. The method of forming an isolation film according to claim 11, wherein conductive impurities are implanted into said semiconductor substrate via said third silicon oxide film.

13. The method of forming an isolation film according to claim 11, wherein the step of removing said second silicon oxide film until said silicon nitride film exposes is executed by a chemical mechanical polishing method.

14. The method of forming an isolation film according to claim 11, wherein, in the step of forming said sidewalls, the width of said sidewall is determined based on the total of the thickness of said first silicon oxide film, the thickness of said third silicon oxide film, and the thickness of said fourth silicon oxide film.

15. The method of forming an isolation film according to claim 11, wherein an etching quantity in said first isotropic etching step is determined based on the total of the thickness of said first silicon oxide film and the thickness of said third silicon oxide film.

16. A method of forming an isolation film, comprising the steps of:

forming a first silicon oxide film on a semiconductor substrate;

forming a silicon nitride film on said first silicon oxide film;

performing patterning to said silicon nitride film and said first silicon oxide film and forming opening portions at which said semiconductor substrate exposes severally in a first region and a second region;

forming sidewalls composed of silicon oxide on the side portions of said silicon nitride film;

etching said semiconductor substrate using said silicon nitride film and said sidewalls as a mask and forming trenches severally in said first region and said second region;

depositing silicon oxide over the entire upper surface of said semiconductor substrate and forming a second silicon oxide film;

removing said second silicon oxide film until said silicon nitride film exposes;

removing said silicon nitride film;

a first isotropic etching in which said first silicon oxide film is removed and isotropic etching is performed to remaining said second silicon oxide film;

a second isotropic etching in which said second region is protected by a first resist film and isotropic etching is performed to said second silicon oxide film in said first region;

removing said first resist film;

oxidizing the surface of said semiconductor substrate and forming a third silicon oxide film;

a third isotropic etching in which said third silicon oxide film is removed and performing isotropic etching to said second silicon oxide film;

oxidizing the surface of said semiconductor substrate and forming a fourth silicon oxide film;

a fourth isotropic etching in which said first region is protected by a second resist film, said fourth silicon oxide film in said second region is removed, and isotropic etching is performed to said second oxide film in said second region;

removing said second resist film; and oxidizing the surface of said semiconductor substrate and forming a fifth silicon oxide film.

17. The method of forming an isolation film according to claim 16, wherein conductive impurities are implanted into said semiconductor substrate via said third silicon oxide film.

18. The method of forming an isolation film according to claim 16, wherein the step of removing said second silicon oxide film until said silicon nitride film exposes is executed by a chemical mechanical polishing method.

19. The method of forming an isolation film according to claim 16, wherein, in the step of forming said sidewalls, the width of said sidewall is determined based on the total of the thickness of said first silicon oxide film, the thickness of said third silicon oxide film, and the thickness of said fourth silicon oxide film.

20. The method of forming an isolation film according to claim 16, wherein an etching quantity in said second isotropic etching step is determined based on the thickness of said third silicon oxide film.

21. A method of forming an isolation film, comprising the steps of:

forming a first silicon oxide film on a semiconductor substrate;

forming a silicon nitride film on said first silicon oxide film;

performing patterning to said silicon nitride film and said first silicon oxide film and forming an opening portion at which said semiconductor substrate exposes in a first region;

etching said semiconductor substrate in said first region using said silicon nitride film as a mask and forming a first trench;

a first isotropic etching in which isotropic etching is performed to said silicon nitride film;

protecting said first region by a first resist film formed on said semiconductor substrate and etching said silicon nitride film and said first silicon oxide film on a second region of said semiconductor substrate via the opening portion of said first resist film;

etching the second region of said semiconductor substrate via the opening portion of said first resist film and forming a second trench;

a second isotropic etching in which isotropic etching is performed to said silicon nitride film in said second region via the opening portion of said first resist film;

removing said first resist film;

depositing silicon oxide over the entire upper surface of said semiconductor substrate and forming a second silicon oxide film;

removing said second silicon oxide film until said silicon nitride film exposes;

removing said silicon nitride film;

a third isotropic etching in which said first silicon oxide film is removed and performing isotropic etching to remaining said second silicon oxide film;

oxidizing the surface of said semiconductor substrate and forming a third silicon oxide film;

a fourth isotropic etching in which said third silicon oxide film is removed, and isotropic etching is performed to said second silicon oxide film;

oxidizing the surface of said semiconductor substrate and forming a fourth silicon oxide film;

a fifth isotropic etching in which said second region is protected by a second resist film, said fourth silicon oxide film in said first region is removed, and isotropic etching is performed to said second silicon oxide film in said first region;

removing said second resist film; and oxidizing the surface of said semiconductor substrate and forming a fifth silicon oxide film.

22. The method of forming an isolation film according to claim 21, wherein conductive impurities are implanted into said semiconductor substrate via said third silicon oxide film.

23. The method of forming an isolation film according to claim 21, wherein the step of removing said second silicon oxide film until said silicon nitride film exposes is executed by a chemical mechanical polishing method.

24. The method of forming an isolation film according to claim 21, wherein an etching quantity in said first isotropic etching step is determined based on the total of the thickness of said first silicon oxide film, the thickness of said third silicon oxide film and the thickness of said fourth silicon oxide film.

25. The method of forming an isolation film according to claim 21, wherein an etching quantity in said second isotropic etching step is determined based on the total of the thickness of said first silicon oxide film and the thickness of said third silicon oxide film.

* * * * *